US009397196B2

(12) United States Patent
Sim et al.

(10) Patent No.: US 9,397,196 B2
(45) Date of Patent: Jul. 19, 2016

(54) METHODS OF MANUFACTURING SEMICONDUCTOR DEVICES THAT INCLUDE PERFORMING HYDROGEN PLASMA TREATMENT ON INSULATING LAYER

(71) Applicant: Samsung Electronics Co., Ltd., Suwon-si, Gyeonggi-do (KR)

(72) Inventors: Hyun-Jun Sim, Hwaseong-si (KR); Jae-Young Park, Yongin-si (KR); Sun-Young Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/699,091

(22) Filed: Apr. 29, 2015

(65) Prior Publication Data

US 2016/0079395 A1 Mar. 17, 2016

(30) Foreign Application Priority Data

Sep. 15, 2014 (KR) .................. 10-2014-0121751

(51) Int. Cl.
| | |
|---|---|
| *H01L 21/428* | (2006.01) |
| *H01L 29/66* | (2006.01) |
| *H01L 21/306* | (2006.01) |
| *H01L 21/762* | (2006.01) |
| *H01L 21/28* | (2006.01) |
| *H01L 29/51* | (2006.01) |
| *H01L 21/02* | (2006.01) |
| *H01L 21/268* | (2006.01) |

(52) U.S. Cl.
CPC .... *H01L 29/66795* (2013.01); *H01L 21/02252* (2013.01); *H01L 21/02351* (2013.01); *H01L 21/2686* (2013.01); *H01L 21/28185* (2013.01); *H01L 21/30604* (2013.01); *H01L 21/76224* (2013.01); *H01L 29/511* (2013.01)

(58) Field of Classification Search
CPC .................................................. H01L 21/2686
See application file for complete search history.

(56) References Cited

U.S. PATENT DOCUMENTS

| | | | | | |
|---|---|---|---|---|---|
| 6,124,216 | A | * | 9/2000 | Ko | H01L 21/02134 257/E21.262 |
| 6,649,538 | B1 | * | 11/2003 | Cheng | H01L 21/28185 257/E21.268 |
| 7,250,370 | B2 | * | 7/2007 | Chang | H01L 21/02126 216/17 |
| 8,367,459 | B2 | * | 2/2013 | Stecker | H01L 51/105 257/E51.007 |

(Continued)

FOREIGN PATENT DOCUMENTS

| | | |
|---|---|---|
| JP | 2006-278580 A | 10/2006 |
| JP | 2008-177419 A | 7/2008 |

(Continued)

*Primary Examiner* — Stephen W Smoot
(74) *Attorney, Agent, or Firm* — Harness, Dickey & Pierce, P.L.C.

(57) ABSTRACT

In a method of manufacturing a semiconductor device, a preliminary gate insulation layer is formed on a substrate, and at least a portion of the substrate serves as a channel region. A hydrogen plasma treatment is performed on the preliminary gate insulation layer to form a gate insulation layer, and the hydrogen plasma treatment supplying a hydrogen-containing gas and an inert gas supply in a chamber via different gas supply parts to form a hydrogen plasma region and an inert gas plasma region in the chamber, respectively. A gate electrode is formed on the gate insulation layer, and impurity regions are formed at upper portions of the substrate adjacent to the gate electrode.

20 Claims, 29 Drawing Sheets

(56) References Cited

U.S. PATENT DOCUMENTS

| | | |
|---|---|---|
| 2005/0032626 A1 | 2/2005 | Song et al. |
| 2005/0233599 A1 | 10/2005 | Sugawara et al. |
| 2006/0214270 A1 | 9/2006 | Iwagami |
| 2008/0087960 A1 | 4/2008 | Hsiao et al. |
| 2009/0239368 A1* | 9/2009 | Park .................. H01L 21/02164 438/592 |
| 2009/0311877 A1* | 12/2009 | Olsen .................. H01L 21/0223 438/770 |
| 2010/0062585 A1 | 3/2010 | Takahashi |
| 2010/0267247 A1* | 10/2010 | Ma ....................... H01J 37/321 438/765 |
| 2011/0114943 A1 | 5/2011 | Yamazaki et al. |

FOREIGN PATENT DOCUMENTS

| | | |
|---|---|---|
| JP | 2009-283527 A | 12/2009 |
| JP | 2011-124556 A | 6/2011 |
| KR | 2004-0098909 A | 11/2004 |
| KR | 2005-0054540 A | 6/2005 |
| KR | 2008-0049882 A | 6/2008 |
| KR | 2009-0021833 A | 3/2009 |
| KR | 2009-0052077 A | 5/2009 |
| KR | 2009-0053965 A | 5/2009 |

* cited by examiner

METHODS OF MANUFACTURING SEMICONDUCTOR DEVICES THAT INCLUDE PERFORMING HYDROGEN PLASMA TREATMENT ON INSULATING LAYER

CROSS-REFERENCE TO RELATED APPLICATION

This application claims priority under 35 USC §119 to Korean Patent Application No. 10-2014-0121751, filed on Sep. 15, 2014 in the Korean Intellectual Property Office (KIPO), the contents of which are herein incorporated by reference in their entirety.

BACKGROUND

1. Field

Some example embodiments relate to methods of manufacturing semiconductor devices. Other example embodiments relate to methods of manufacturing semiconductor devices including transistors.

2. Description of the Related Art

Transistors of a semiconductor device need to have improved operation characteristics and a higher reliability.

SUMMARY

Example embodiments provide a method of manufacturing a semiconductor device including a transistor having improved operation characteristics and a higher reliability.

According to example embodiments, there is provided a method of manufacturing a semiconductor device. In the method, a preliminary gate insulation layer is formed on a substrate, and at least a portion of the substrate serves as a channel region. A hydrogen plasma treatment is performed on the preliminary gate insulation layer to form a gate insulation layer, the hydrogen plasma treatment including supplying a hydrogen-containing gas and an inert gas supply in a chamber via different gas supply parts to form a hydrogen plasma region and an inert gas plasma region in the chamber, respectively. A gate electrode is formed on the gate insulation layer, and impurity regions are formed at upper portions of the substrate adjacent to the gate electrode.

In example embodiments, a frequency power of about 2 GHz to about 3 GHz may be used in the hydrogen plasma treatment, and the hydrogen plasma region and the inert gas plasma region may be formed by a microwave method.

In example embodiments, the gas supply parts may include a first gas supply part for supplying the hydrogen-containing gas and a second gas supply part for supplying the inert gas, the first supply part being closer to the substrate than the second supply part, and the hydrogen plasma region may be formed closer to the substrate than the inert gas plasma region.

In example embodiments, the hydrogen plasma region may be at a lower level than the inert gas plasma region in the chamber.

In example embodiments, prior to forming the preliminary gate insulation layer, the substrate may be etched to form a trench, and an isolation layer may be formed to fill a lower portion of the trench so that an active fin may be defined.

In example embodiments, prior to forming the preliminary gate insulation layer, a hydrogen plasma treatment may be performed on the substrate.

In example embodiments, after forming the gate electrode, a hydrogen plasma treatment may be performed on the gate electrode.

In example embodiments, forming the preliminary gate insulation layer may include forming at least two layers including a first insulation layer and a second insulation layer, and the hydrogen plasma treatment may include a first hydrogen plasma treatment after forming the first insulation layer and a second hydrogen plasma treatment after forming the second insulation layer.

According to example embodiments, there is provided a method of manufacturing a semiconductor device. In the method, impurity regions are formed in portions of a substrate, and the impurity regions serve as source and drain regions. An insulating interlayer is formed on the substrate, the insulating layer including an opening exposing a top surface of the substrate between the impurity regions. A preliminary gate insulation layer is formed on the exposed top surface of the substrate and a sidewall and a top surface of the insulating interlayer. A hydrogen plasma treatment is performed on the preliminary gate insulation layer to form a gate insulation layer. A gate electrode is formed on the gate insulation layer and filling the opening.

In example embodiments, performing the hydrogen plasma treatment may include loading the substrate including the preliminary gate insulation layer thereon into a chamber, supplying a hydrogen-containing gas and an inert gas into the chamber via different gas supply parts, and forming a hydrogen plasma region and an inert gas plasma region in the chamber.

In example embodiments, the gas supply parts may include a first gas supply part for supplying the hydrogen-containing gas and a second gas supply part for supplying the inert gas, the first supply part being closer to the substrate than the second supply part, and the hydrogen plasma region may be formed closer to the substrate than the inert gas plasma region.

In example embodiments, a frequency power of about 2 GHz to about 3 GHz may be used in the hydrogen plasma treatment, and the hydrogen plasma region and the inert gas plasma region may be formed by a microwave method.

In example embodiments, prior to forming the preliminary gate insulation layer, a hydrogen plasma treatment may be further performed on the top surface of the substrate exposed by the opening.

In example embodiments, forming the preliminary gate insulation layer may include forming at least two layers including a first insulation layer and a second insulation layer, and the hydrogen plasma treatment may include a first hydrogen plasma treatment after forming the first insulation layer and a second hydrogen plasma treatment after forming the second insulation layer.

In example embodiments, each of the first and second insulation layers may include one of silicon oxide, silicon oxynitride, a metal and metal oxide.

According to example embodiments, there is provided a method of manufacturing a semiconductor device. In the method, an oxide layer is formed on a substrate. The substrate including the oxide layer is loaded in a chamber. A hydrogen plasma treatment is performed on the oxide layer, and the hydrogen plasma treatment includes forming a hydrogen plasma region over the oxide layer by supplying a hydrogen-containing gas to the chamber via a first gas supply port, and forming an inert gas plasma region over the hydrogen plasma region by supplying an inert gas to the chamber via a second gas supply port.

In example embodiments, the hydrogen plasma treatment may use a frequency power of about 2 GHz to about 3 GHz to form the hydrogen plasma region and the inert gas plasma region by a microwave method.

In example embodiments, the substrate may be loaded onto a loading chuck at a lower portion of the chamber.

In example embodiments, the substrate may be loaded onto a loading chuck heated to a temperature of about 300° C. to about 500° C., and the hydrogen plasma treatment may be performed at a pressure in a range of about 1 mTorr to about 100 Torr for about 0.5 minutes to about 10 minutes.

In example embodiments, the method may further include forming a gate electrode on the plasma-treated oxide layer, and forming impurity regions at upper portions of the substrate adjacent to the gate electrode.

According to example embodiments, the transistor including a gate insulation pattern having no or reduced defects may be formed by performing relatively simple processes. The semiconductor device including the transistor may have improved operation characteristics and a higher reliability.

BRIEF DESCRIPTION OF THE DRAWINGS

Example embodiments will be more clearly understood from the following detailed description taken in conjunction with the accompanying drawings. FIGS. 1 to 33 represent non-limiting, example embodiments as described herein.

FIGS. 1, 2 and 4 to 6 are cross-sectional views illustrating stages of a method of manufacturing a semiconductor device in accordance with example embodiments;

FIG. 3 is cross-sectional view illustrating a plasma apparatus for performing a hydrogen plasma treatment in accordance with example embodiments;

FIGS. 16 to 23 are cross-sectional views illustrating stages of a method of manufacturing a semiconductor device in accordance with example embodiments;

FIGS. 24 to 26 are cross-sectional views illustrating stages of a method of manufacturing a semiconductor device in accordance with example embodiments;

FIGS. 27 to 29 are cross-sectional views illustrating stages of a method of manufacturing a semiconductor device in accordance with example embodiments;

FIG. 30 is a graph illustrating a gate current density "jg" versus an equivalent oxide thickness of each of Example 1 and Comparative Example 1;

FIG. 31 is a graph illustrating charge pumping current "Icp" versus a gate voltage of each of Example 1 and Comparative Example 1;

FIG. 32 shows intensities of carbon measured by time-of-flight secondary ion mass spectrometry (TOF-SIMS) in a silicon oxide layer and a substrate of Example 2 and in those of Comparative Example 2, respectively; and FIG. 33 shows intensities of fluorine measured by TOF-SIMS in a silicon oxide layer and a substrate of Example 2 and in those of Comparative Example 2, respectively.

DETAILED DESCRIPTION

Figure 1:
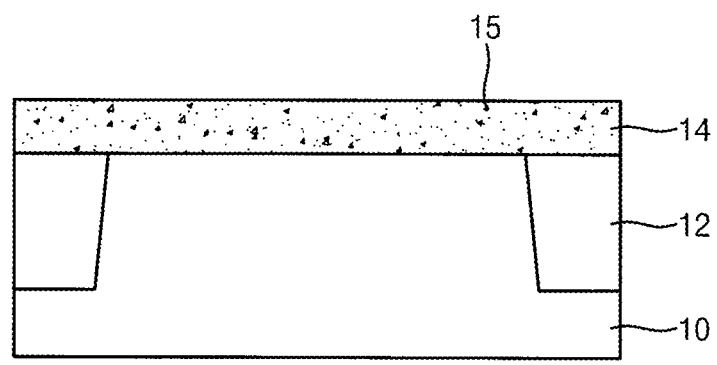

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises", "includes", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 2 and 4 to 6 are cross-sectional views illustrating stages of a method of manufacturing a semiconductor device in accordance with example embodiments. FIG. 3 is a cross-sectional view illustrating a plasma apparatus for performing a hydrogen plasma treatment in accordance with example embodiments.

Referring to FIG. 1, a shallow trench isolation (STI) process may be performed to form an isolation pattern 12 on a substrate 10. Particularly, an upper portion of the substrate 10 may be partially etched to form trenches (not shown), and an isolation layer may be formed on the substrate 10 to fill the trenches. The isolation layer may be planarized to form the isolation pattern 12. A preliminary gate insulation layer 14 may be formed on the substrate 10 and the isolation pattern 12.

The substrate 10 may be a silicon substrate, a germanium substrate, a silicon-germanium substrate, or a Group III-V compound semiconductor substrate including GaP, GaAs, or GaSb. In example embodiments, the substrate 10 may include a silicon-on-insulator (SOI) substrate and/or a germanium-on-insulator (GOI) substrate. The substrate 10 may have a crystalline semiconductor, for example, a single crystalline semiconductor. At least a portion of an upper surface of the substrate 10 may serve as a channel region of a metal-oxide-semiconductor (MOS) transistor.

The preliminary gate insulation layer 14 may be formed to include an oxide, e.g., silicon oxide, silicon oxynitride and/or a metal oxide. The preliminary gate insulation layer 14 may include a single layer or a plurality of layers. The metal oxide may have a dielectric constant higher than that of silicon oxide. The metal oxide may include, e.g., hafnium oxide, tantalum oxide and/or zirconium oxide.

The preliminary gate insulation layer 14 may be formed by a thermal oxidation process, a chemical vapor deposition (CVD) process and/or an atomic layer deposition (ALD) process. In example embodiments, a silicon oxide layer may be formed on the substrate 10 by a thermal oxidation process, and the silicon oxide layer may be transformed into a silicon oxynitride layer by a nitridation process, so that the preliminary gate insulation layer 14 including silicon oxynitride may be formed.

When the preliminary gate insulation layer 14 may be formed by a thermal oxidation process, the preliminary gate insulation layer 14 may be formed only on an active region between the trenches on the substrate 10.

The preliminary gate insulation layer 14 may include various defects 15 therein. For example, the preliminary gate insulation layer 14 may include undesired elements, e.g., carbon and/or fluorine, which may degrade electrical characteristics thereof. Also, the preliminary gate insulation layer 14 may include dangling bonds or vacancies of atoms serving as trap sites of electrons or holes. The electrical characteristics and reliability of a MOS transistor including the preliminary gate insulation layer 14 may be degraded due to the defects 15 thereof.

The substrate 10 may have a crystalline material, while the preliminary gate insulation layer 14 may have an amorphous material. As the crystalline material and the amorphous material contact each other, mismatch may be generated at an interface between the substrate 10 and the preliminary gate insulation layer 14. Thus, due to the mismatch, defects, e.g., trap sites, may be formed at the interface between the substrate 10 and the preliminary gate insulation layer 14. The interface may include the channel region of the MOS transistor, and the charge mobility of the MOS transistor may be decreased by the trap sites in the channel region so that the electrical characteristics and reliability of the MOS transistor may be degraded.

Figure 2:
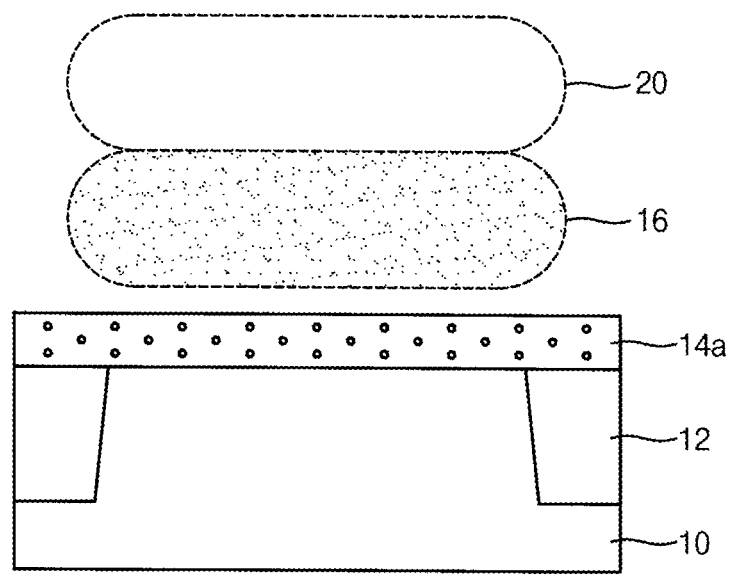
Figure 3:
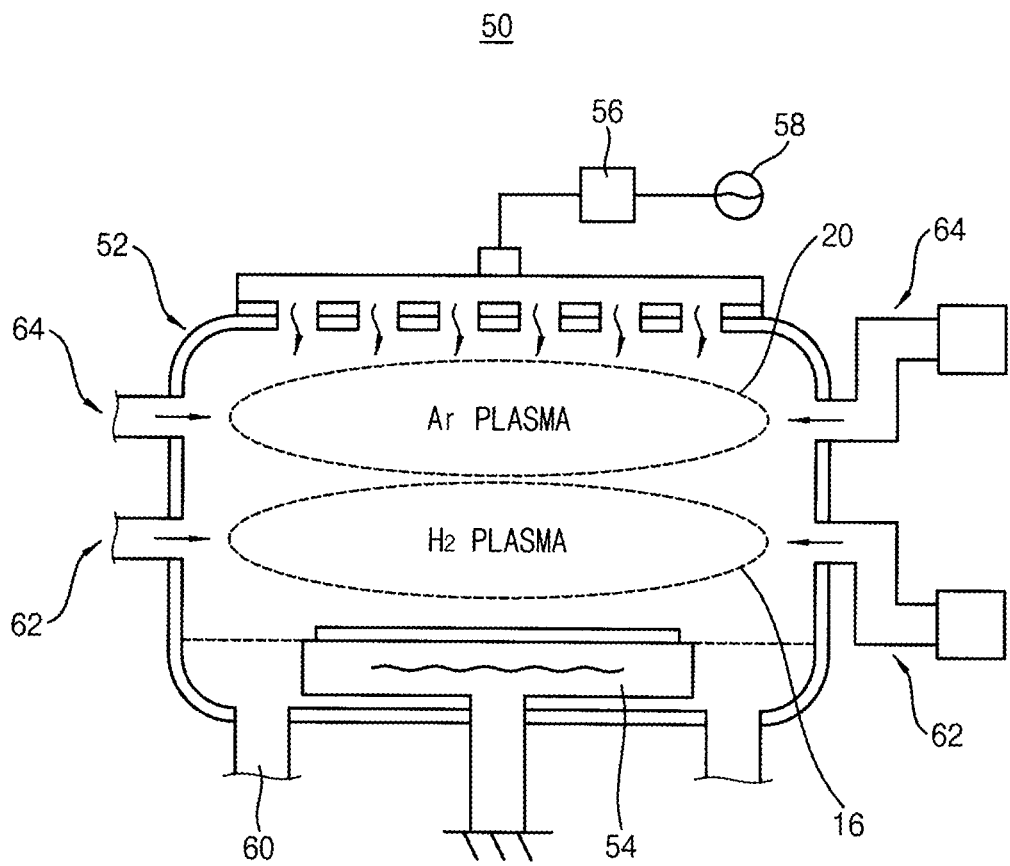

Referring to FIG. 2, a hydrogen plasma treatment may be performed on the preliminary gate insulation layer 14 so that a gate insulation layer 14a may be formed. The gate insulation layer 14a may include fewer defects 15 than the preliminary gate insulation layer 14.

During the hydrogen plasma treatment, hydrogen radicals and/or hydrogen ions may penetrate the interface between the substrate 10 and the preliminary gate insulation layer 14, and may be chemically bonded to the defects 15 or may apply a force to the defects 15. Thus, the defects 15 may be passivated or removed. Also, the undesired elements, e.g., carbon or fluorine, in the preliminary gate insulation layer 14 may be reduced.

Conditions of the hydrogen plasma treatment may be controlled so that damages to the substrate 10 or the preliminary gate insulation layer 14 may be reduced, and the effect of the passivation of the defects 15 may increase.

If the hydrogen plasma treatment is performed at a temperature higher than about 500° C. the characteristics of the substrate 10 ad/or the preliminary gate insulation layer 14 may be changed due to heat. For example, a silicon-germanium substrate may have a melting point that may vary according to a concentration of germanium therein, and the melting point of the silicon-germanium substrate may be in a range of about 500° C. to about 600° C. Thus, if the hydrogen plasma treatment is performed at a temperature higher than about 500° C. characteristics of the silicon-germanium substrate may be changed. If the hydrogen plasma treatment is performed at a temperature lower than about 300° C. the defects 15 may not be sufficiently cured. Therefore, the hydrogen plasma treatment may be performed at a temperature, for example, of about 300° C. to about 500° C.

In the hydrogen plasma treatment, plasma may be generated by a microwave method using a relatively high frequency power of about 2 GHz to about 3 GHz. For example, a relatively high frequency power of about 2.45 GHz may be used in the microwave method. By the microwave method, the damage to the substrate 10 or the preliminary gate insulation layer 14 may be efficiently cured even at a lower temperature.

In the microwave method, a relatively high frequency power higher than the relatively high frequency power of about 13.56 MHz used in an RF plasma method or a DC power used in a DC plasma method may be used so that a volume of hydrogen plasma may be small. Also, hydrogen radicals and hydrogen ions may be at a relatively low temperature in a plasma chamber, so that plasma damages to the substrate 10 and the preliminary gate insulation layer 14 may be reduced.

In the hydrogen plasma treatment, a hydrogen-containing gas and an inert gas may be used. The hydrogen-containing gas may include, e.g., H, $H_2$, $D_2$ and/or $NH_3$, and the inert gas may include, e.g., He, Ne, Ar, Xr, Xe and/or Rn.

The hydrogen-containing gas and the inert gas may be supplied to the chamber via different gas supply parts in an unmixed state. The hydrogen-containing gas may be supplied to a position in the chamber adjacent to a chuck on which the substrate 10 may be loaded, and the inert gas may be supplied to a position in the chamber far from the loading chuck. When the substrate 10 may be loaded to a lower portion in the chamber, the hydrogen-containing gas may be supplied to the lower portion in the chamber, and the inert gas may be supplied to an upper portion in the chamber. Thus, a hydrogen plasma region may be formed closer to the substrate 10 than a plasma region generated by the inert gas. The hydrogen plasma region may be referred to as a first plasma region 16 and the plasma region generated by the inert gas may be referred to as a second plasma region 20.

Hydrogen radicals may have a relatively short life time, and thus it may be difficult for the hydrogen radicals to reach the substrate 10. However, in example embodiments, as the first plasma region 16 may be formed closer to the substrate 10, the hydrogen radicals may reach the substrate 10 more easily although the hydrogen radicals may have a relatively short life time. Thus, the defects of the substrate 10 and the preliminary gate insulation layer 14 may be effectively passivated by the hydrogen radicals.

If the hydrogen plasma treatment is performed during less than about 0.5 minutes, the defects may not be passivated sufficiently. If the hydrogen plasma treatment is performed during more than about 10 minutes, the substrate 10 and/or the preliminary gate insulation layer 14 may be damaged. Thus, the hydrogen plasma treatment may be performed from about 0.5 minutes to about 10 minutes. The hydrogen plasma treatment may be performed under a pressure of about 1 mTorr to about 100 Torr.

Hereinafter, referring to FIG. 3, a plasma apparatus for performing a hydrogen plasma treatment and a method of performing the hydrogen plasma treatment using the plasma apparatus may be illustrated.

Referring to FIG. 3, a plasma apparatus 50 may include a chamber 52. A loading chuck 54 for supporting the substrate 10 may be disposed at a lower portion in the chamber 52. A heater (not shown) for heating the substrate 10 may be disposed at an inner portion of the loading chuck 54.

An inductive coupling antenna (not shown) may be disposed in the chamber 52. In example embodiments, the inductive coupling antenna may be disposed to face the loading chuck 54. The inductive coupling antenna may extend to an outside of the chamber 52, and the extended portion of the inductive coupling antenna may be connected to a relatively high frequency power source 58 via a matching box 56. The relatively high frequency power may be in a range of about 2 GHz to about 3 GHz. Thus, the first and second plasma regions 16 and 20 may be formed by the microwave method using the plasma apparatus 50.

An exhausting pump 60 may be connected to a bottom of the chamber 52.

At least two gas supply parts, e.g., first and second gas supply parts 62 and 64 may be disposed at a sidewall of the chamber 52 to supply gases into the chamber 52. The first and second gas supply parts 62 and 64 may be disposed at different portions of the sidewall of the chamber 52 in a vertical direction.

The first gas supply part 62 may be disposed at a lower sidewall of the chamber 52, and the second gas supply part 64 may be disposed at a higher sidewall of the chamber 52. The first gas supply part 62 may be closer to the loading chuck 54 than the second supply part 54.

The first gas supply part 62 may supply a source gas for a plasma treatment on the substrate 10, and the second gas supply part 64 may supply an inert gas.

Hereinafter, a method of forming the gate insulation layer 14a by a hydrogen treatment using the plasma apparatus 50 may be described.

The substrate 10 on which the preliminary gate insulation layer 14 may be formed may be loaded onto the loading chuck 54 in the chamber 52. The loading chuck 54 may be heated to a temperature of about 300° C. to about 500° C. A pressure of the chamber 52 may be in a range of about 1 mTorr to about 100 Torr.

A hydrogen-containing gas may be supplied via the first gas supply part 62, and the inert gas may be supplied via the second gas supply part 64. The first plasma region 16 and the second plasma region 20 may be generated in the chamber 52 by the relatively high frequency power source. The first plasma region 16 may be disposed adjacent to the loading chuck 54 in the chamber 52. The second plasma region 20 may be disposed over the first plasma region 16 in the chamber 52 so that the second plasma region 20 may be relatively far from the loading chuck 54. The hydrogen plasma treatment may be performed during about 0.5 minutes to about 10 minutes.

As illustrated above, the hydrogen plasma treatment may be performed on the preliminary gate insulation layer 14 so that the gate insulation layer 14a may be formed. A content of carbon in the gate insulation layer 14a may be less than about 70% of that in the preliminary gate insulation layer 14, and a content of fluorine in the gate insulation layer 14a may be less than about 70% of that in the preliminary gate insulation layer 14. In example embodiments, the content of carbon in the gate insulation layer 14a may be about 20% to about 50% of that in the preliminary gate insulation layer 14, and the content of fluorine in the gate insulation layer 14a may be about 20% to about 50% of that in the preliminary gate insulation layer 14. Also, a sum of the contents of carbon and fluorine in the gate insulation layer 14a may be less than about 10% of that of the total elements in the gate insulation layer 14a.

Figure 4:
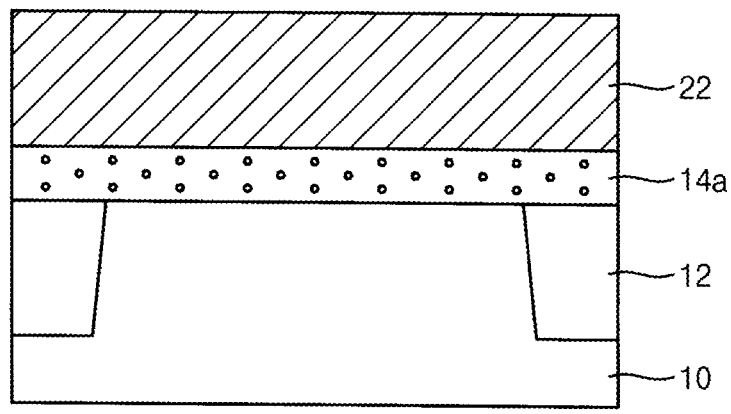

Referring to FIG. 4, a gate electrode layer 22 may be formed on the gate insulation layer 14a. The gate electrode layer 22 may be formed to include, e.g., polysilicon or a metal.

The gate electrode layer 22 may be formed by a CVD process, an ALD process and/or a physical vapor deposition (PVD) process.

Figure 5:
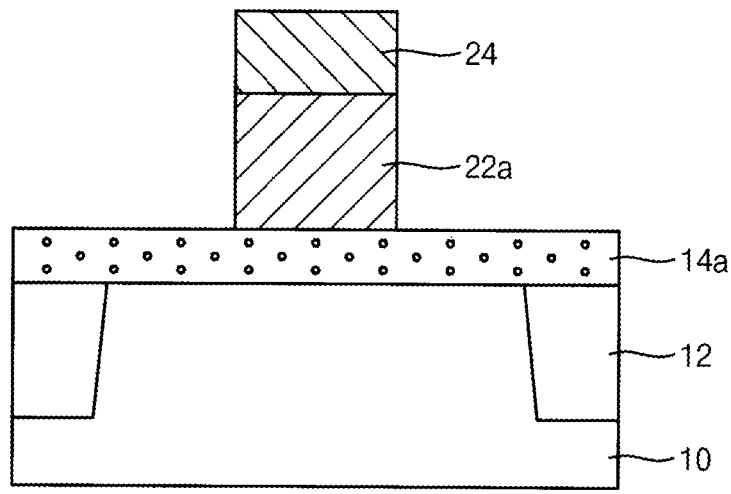

Referring to FIG. 5, a hard mask 24 may be formed on the gate electrode layer 22. The hard mask 24 may be formed to include, e.g., silicon nitride. The gate electrode layer 22 may be etched using the hard mask 24 as an etching mask to form a gate electrode 22a.

In example embodiments, the hydrogen plasma treatment may be further performed on the substrate 10 after forming the gate electrode layer 22. The hydrogen plasma treatment may be substantially the same as or similar to that illustrated with reference to FIGS. 2 and 3.

Figure 6:
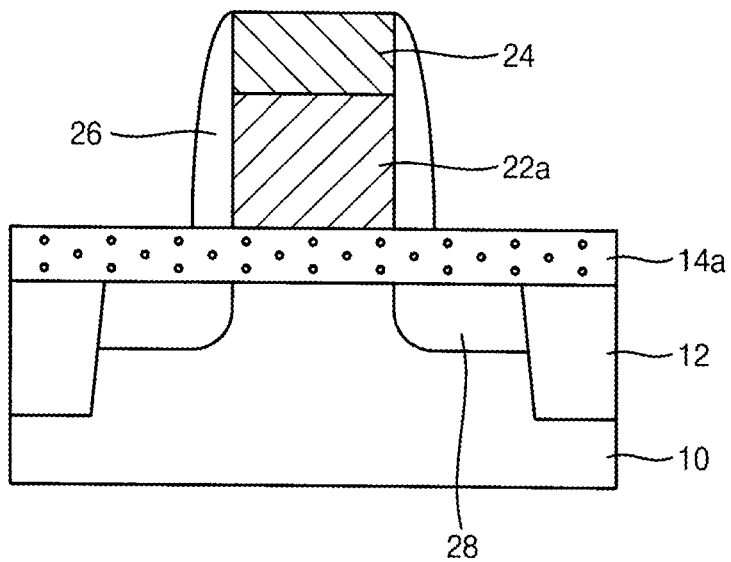

Referring to FIG. 6, a spacer layer (not shown) may be formed on the gate electrode 22a, the hard mask 24 and the gate insulation layer 14a. The spacer layer may be formed to include an insulation material, e.g., silicon nitride or silicon oxide. The spacer layer may be formed by an ALD process and/or a CVD process.

The spacer layer may be anisotropically etched to form spacers 26 on sidewalls of the gate electrode 22a and the hard mask 24.

Impurities may be doped into the substrate 10 adjacent to the sidewalls of the gate electrode 22a to form impurity regions 28. The impurity regions 28 may serve as source/drain regions of the MOS transistor.

As illustrated above, the MOS transistor may be formed to include the gate insulation layer 14a having reduced defects and/or undesired elements, e.g., carbon and/or fluorine. Thus, the MOS transistor may have improved electrical characteristics. Also, the defects 15 of the gate insulation layer 14a and the interface between the gate insulation layer 14a and the substrate 10 may decrease so that the MOS transistor may have reduced leakage currents and a higher reliability.

In example embodiments, the hydrogen plasma treatment may be used for forming the gate insulation layer 14a of the MOS transistor, regardless of the structure of the MOS transistor.

FIGS. 7A, 8A, 9A, and 10A are perspective views illustrating stages of a method of manufacturing a semiconductor device in accordance with example embodiments. FIGS. 7B, 8B, 9B and 10B are cross-sectional views illustrating the stages of the method of manufacturing the semiconductor device in accordance with example embodiments. FIGS. 7B, 8B, 9B and 10B show cross-sectional views cut along lines I-I' and II-II' of FIGS. 7A, 8A, 9A, and 10A, respectively.

Figure 7A:
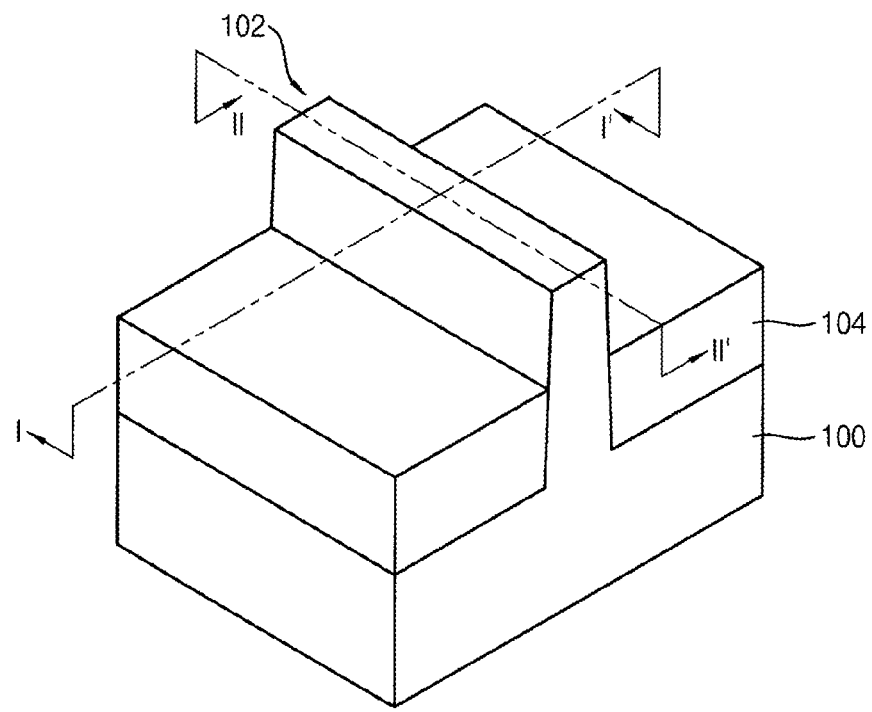
FIGS. 7A, 8A, 9A, and 10A are perspective views illustrating stages of a method of manufacturing a semiconductor device in accordance with example embodiments.
Figure 7B:
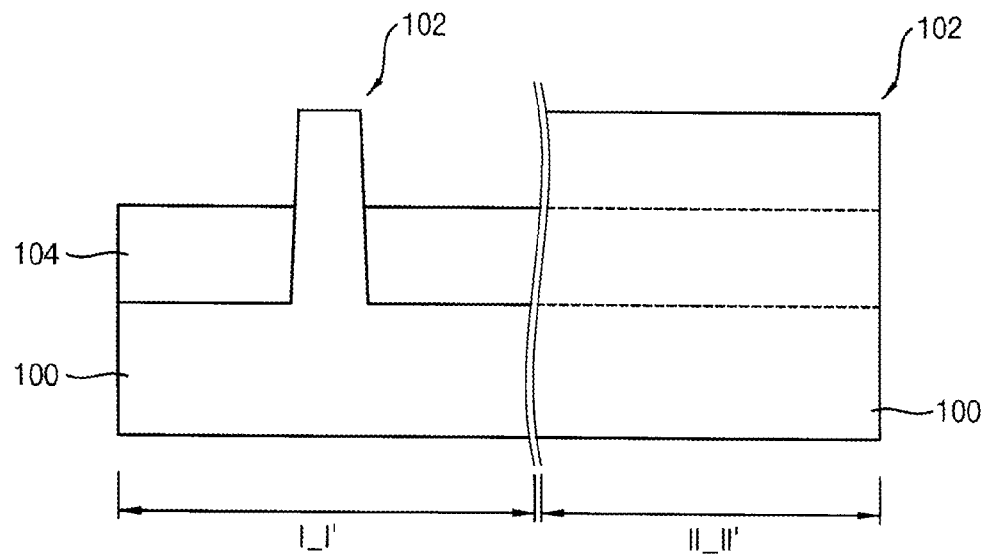
FIGS. 7B, 8B, 9B and 10B are cross-sectional views illustrating the stages of the method of manufacturing the semiconductor device in accordance with example embodiments.

Referring to FIGS. 7A and 7B, an isolation layer 104 and an active fin 102 may be formed on the substrate 100.

The substrate 100 may be a silicon substrate, a germanium substrate, a silicon-germanium substrate, or a Group III-V compound substrate including GaP, GaAs, or GaSb. In example embodiments, the substrate 100 may include a silicon-on-insulator (SOI) substrate and/or a germanium-on-insulator (GOI) substrate. The substrate 100 may have a crystalline semiconductor, for example, a single crystalline semiconductor.

Particularly, an upper portion of the substrate 100 may be partially etched to form a trench. An insulation layer may be formed to sufficiently fill the trench on the substrate 100, and may be planarized until a top surface of the substrate 100 may be exposed. An upper portion of the insulation layer may be etched to expose upper sidewalls of the trench, so that the isolation layer 104 filling a lower portion of the trench may be formed. The insulation layer 104 may include an oxide, e.g., silicon oxide. An upper portion of the substrate 100 protruding from a top surface of the isolation layer 104 may serve as the active fin 102. The active fin 102 may include a material substantially the same as that of the substrate 100.

The isolation layer 104 may define a field region and an active region.

In example embodiments, impurities may be lightly doped into the active fin 102 so that a threshold voltage of a transistor may be controlled.

Figure 8A:
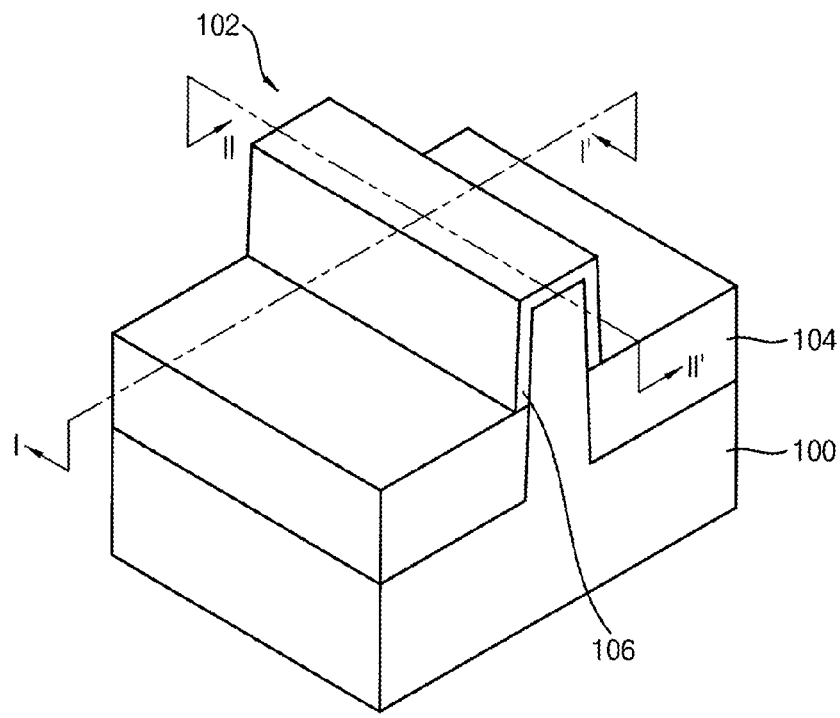
Figure 8B:
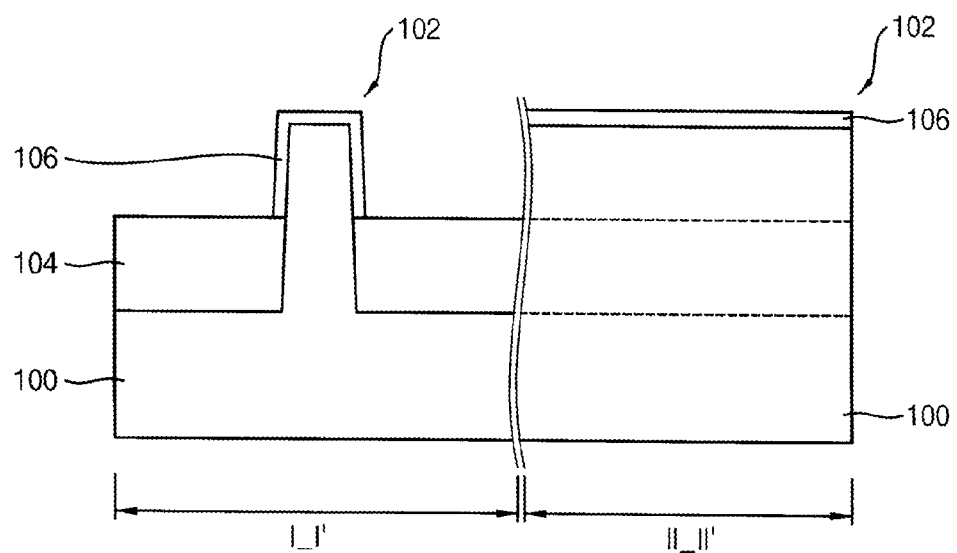

Referring to FIGS. 8A and 8B, a preliminary gate insulation layer 106 may be formed on a surface of the active fin 102.

The preliminary gate insulation layer 106 may be formed to include an oxide, e.g., silicon oxide, silicon oxynitride and/or a metal oxide. The preliminary gate insulation layer 106 may include a single layer or a plurality of layers. The metal oxide may have a dielectric constant higher than that of silicon oxide. The metal oxide may include, e.g., hafnium oxide, tantalum oxide and/or zirconium oxide.

The preliminary gate insulation layer 106 may be formed by a thermal oxidation process, a CVD process and/or an ALD process.

When the preliminary gate insulation layer 106 may be formed by a thermal oxidation process, the preliminary gate insulation layer 106 may be formed only on the surface of the active fin 102. Alternatively, when the preliminary gate insulation layer 106 may be formed by a CVD process or an ALD process, the preliminary gate insulation layer 106 may be conformally formed on the active fin 102 and the isolation layer 104.

Sidewalls and a top surface of the active fin 102 may have different crystal orientations to each other. According to conditions of an etching process, the sidewalls of the active fin 102 may have different slopes, and the top surface of the active fin 102 may not be flat. Thus, the surface of the active fin 102 serving as a channel region of a transistor may have various crystal orientations. Also, it may be difficult for the preliminary gate insulation layer 106 on the active fin 102 to have a uniform thickness and an insulation property.

As illustrated in FIG. 1, the preliminary gate insulation layer 106 may include various defects 15 therein. For example, the preliminary gate insulation layer 106 may include undesired elements, e.g., carbon or fluorine, which may degrade electrical characteristics thereof. Also, the preliminary gate insulation layer 106 may include trap sites of electrons or holes.

Figure 9A:
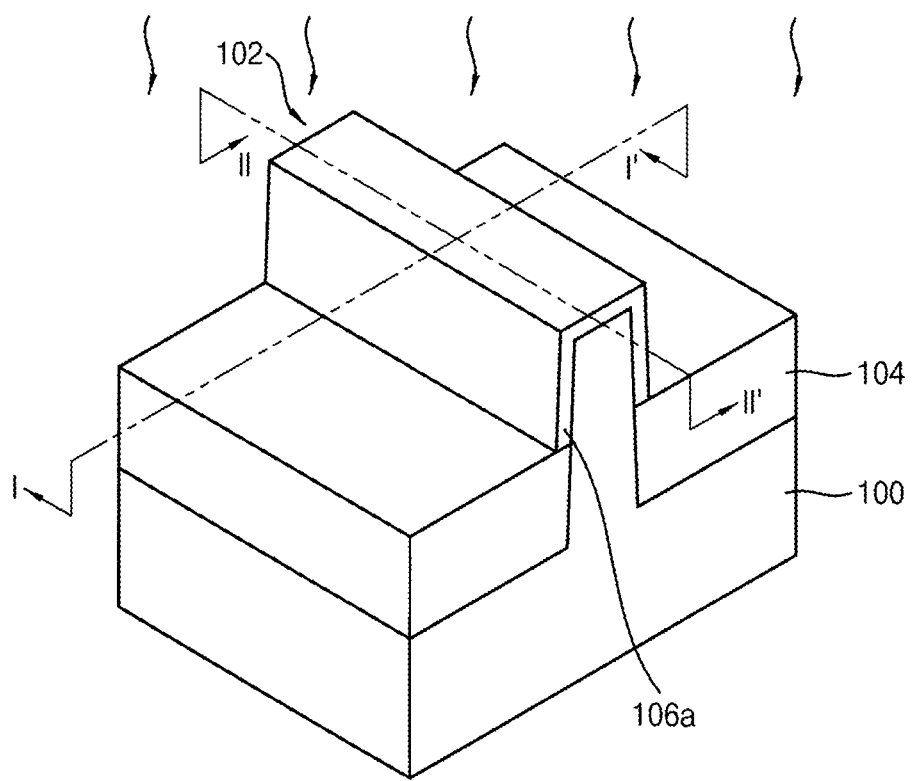
Figure 9B:
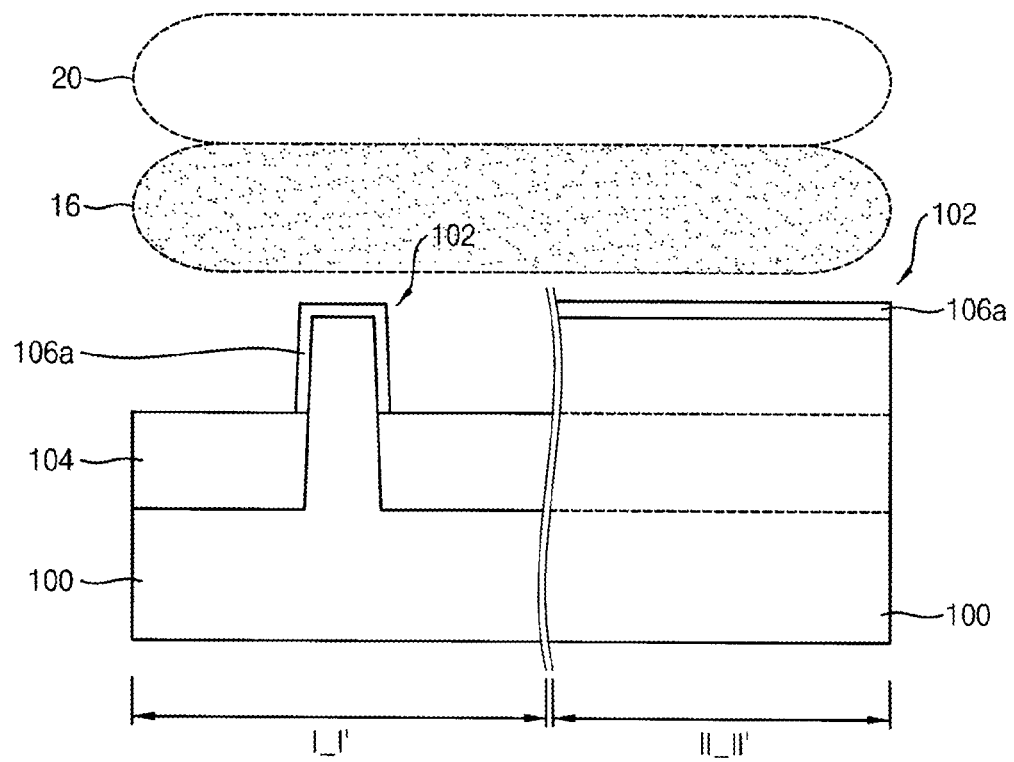

Referring to FIGS. 9A and 9B, a hydrogen plasma treatment may be performed on the preliminary gate insulation layer 106 to form a gate insulation layer 106a. The hydrogen plasma treatment may be substantially the same as or similar to that illustrated with reference to FIGS. 2 and 3. The gate insulation layer 106a may have reduced defects and undesired elements, e.g., carbon or fluorine.

A thickness of the gate insulation layer 106a may be more uniform than that of the preliminary gate insulation layer 106 before performing the hydrogen plasma treatment. Particularly, a uniformity of a layer may be defined as a ratio of a second thickness "B" thereof on the sidewalls of the active fin 102 with respect to a first thickness "A" thereof on the top surface of the active fin 102, which may become "B/A". The uniformity of the gate insulation layer 106a may be higher than that of the preliminary gate insulation layer 106 by at least about 5%. Particularly, the uniformity of the gate insulation layer 106a may be higher than that of the preliminary gate insulation layer 106 by about 5% to about 20%. Thus, the first and second thicknesses of the gate insulation layer 106a may be substantially the same.

If the gate insulation layer 106a may not have a uniform thickness, a relatively thin portion of the gate insulation layer 106a may be electrically attacked during an operation of the transistor, and a failure may be generated at the relatively thin portion. However, in example embodiments, the gate insulation layer 106a may be formed to have a uniform thickness so that the transistor may have improved electrical characteristics. The hydrogen plasma region including the first plasma region 16 and the second plasma region 20 may be formed as described above with respect to FIGS. 2 and 3.

Figure 10A:
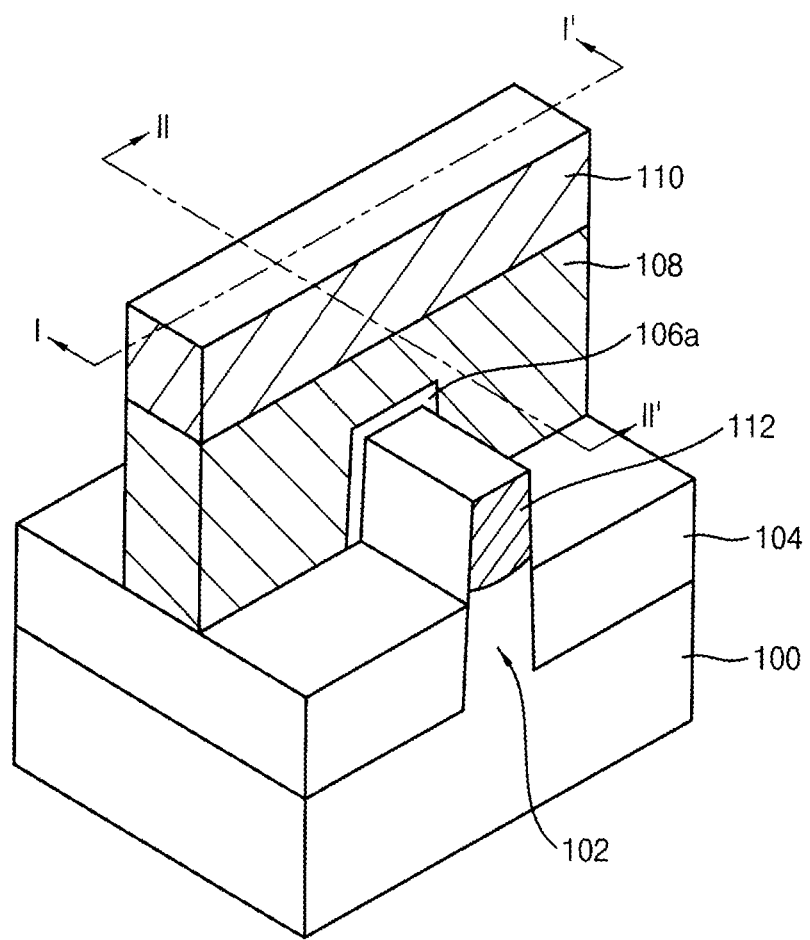
Figure 10B:
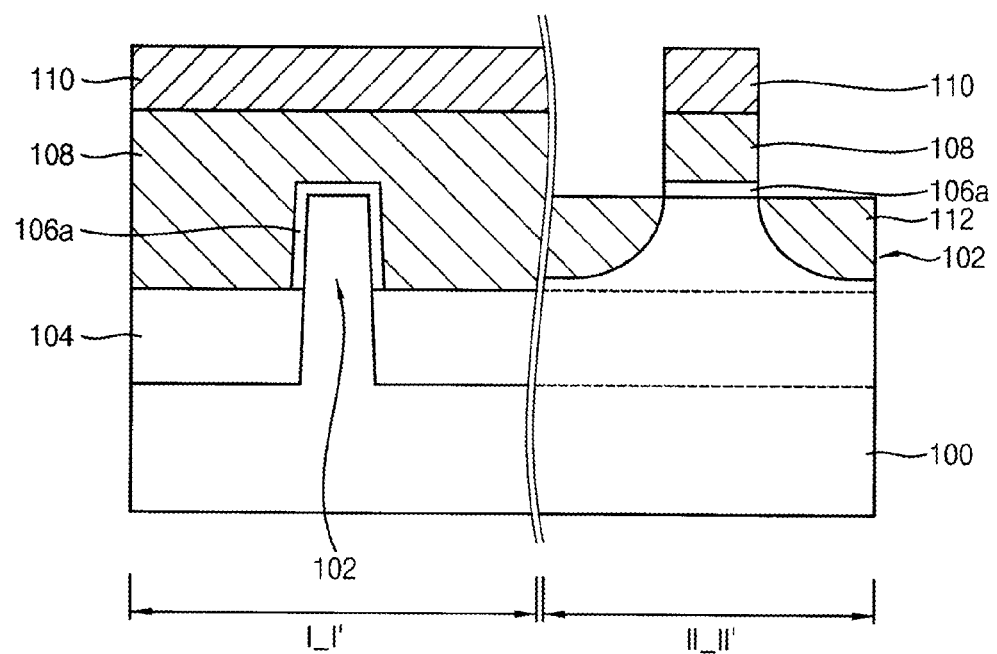

Referring to FIGS. 10A and 10B, a gate electrode layer may be formed on the gate insulation layer 106a.

A hard mask 110 may be formed on the gate electrode layer, and the gate electrode layer may be etched using the hard mask 110 as an etching mask to form a gate electrode 108. The gate electrode layer may be formed to include, e.g., polysilicon or a metal. The hard mask 110 may be formed to include, e.g., silicon nitride.

In example embodiments, the hydrogen plasma treatment may be further performed after forming the gate electrode 108.

Impurities may be doped into the substrate 100 to form impurity regions 112 at the active fin 102 adjacent to the sidewalls of the gate electrode 108. The impurity regions 112 may serve as source/drain regions of the transistor. A spacer (not shown) may be formed on sidewalls of the gate electrode 108, and impurities may be further doped into the substrate 100.

As illustrated above, a finFET may be formed to include the gate insulation layer 106a having reduced defects and undesired elements, e.g., carbon and/or fluorine. Thus, a semiconductor device including the finFET may have improved electrical characteristics and higher reliability.

FIGS. 11A, 12A, 13A, 14A and 15A are perspective views illustrating stages of a method of manufacturing a semiconductor device in accordance with example embodiments. FIGS. 11B, 12B, 13B, 14B and 15B are cross-sectional views illustrating the stages of the method of manufacturing the semiconductor device in accordance with example embodiments. FIGS. 11B, 12B, 13B, 14B and 15B show cross-sectional views cut along lines I-I' and lines II-II' of FIGS. 11A, 12A, 13A, 14A and 15A, respectively.

A process substantially the same as or similar to that illustrated with reference to FIGS. 7A and 7B may be performed to form an isolation layer 104 and an active fin 102 on the substrate 100.

Figure 11A:
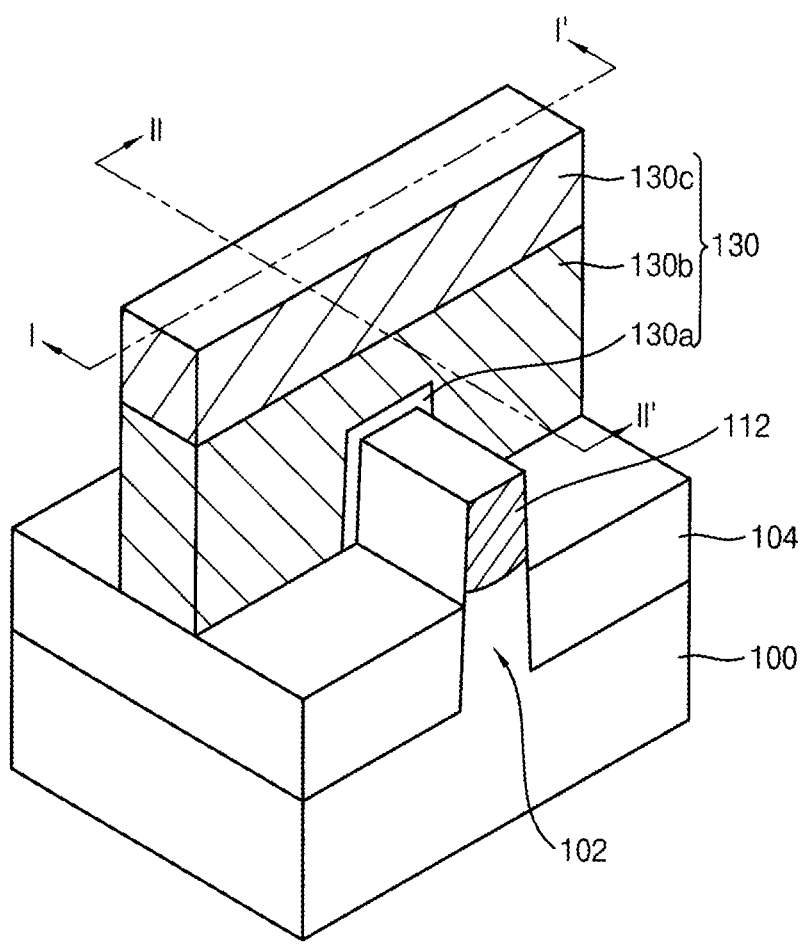
FIGS. 11A, 12A, 13A, 14A and 15A are perspective views illustrating stages of a method of manufacturing a semiconductor device in accordance with example embodiments.
Figure 11B:
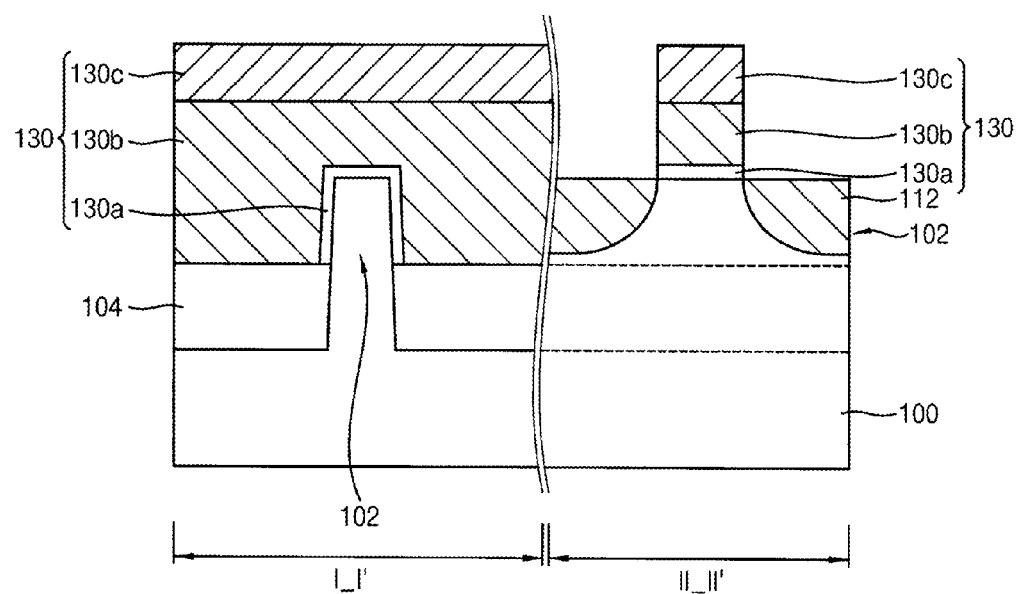
FIGS. 11B, 12B, 13B, 14B and 15B are cross-sectional views illustrating the stages of the method of manufacturing the semiconductor device in accordance with example embodiments.

Referring to FIGS. 11A and 11B, a dummy gate structure 130 may be formed on the isolation layer 104 and the active fin 102 of substrate 100. The dummy gate structure 130 may be formed to include a dummy gate insulation pattern 130a, a dummy gate electrode 130b and a first mask 130c.

The dummy gate insulation pattern 130a may be formed to include an oxide, e.g., silicon oxide, and the dummy gate electrode 130b may be formed to include, e.g., polysilicon. The first mask 130c may be formed to include a nitride, e.g., silicon nitride.

Particularly, a dummy gate insulation layer and a dummy gate electrode layer may be sequentially formed on the substrate 100. The first mask 130c may be formed on the dummy gate electrode layer. The dummy gate electrode layer and the dummy gate insulation layer may be etched using the first mask 130c as an etching mask to form the dummy gate structure 130.

In example embodiments, spacers (not shown) including an insulation material may be further formed on sidewalls of the dummy gate structure 130.

Impurities may be doped into the substrate 100 adjacent to the dummy gate structure 130 to form impurity regions 112 at the active fin 102. The impurity regions 112 may serve as source/drain regions.

Figure 12A:
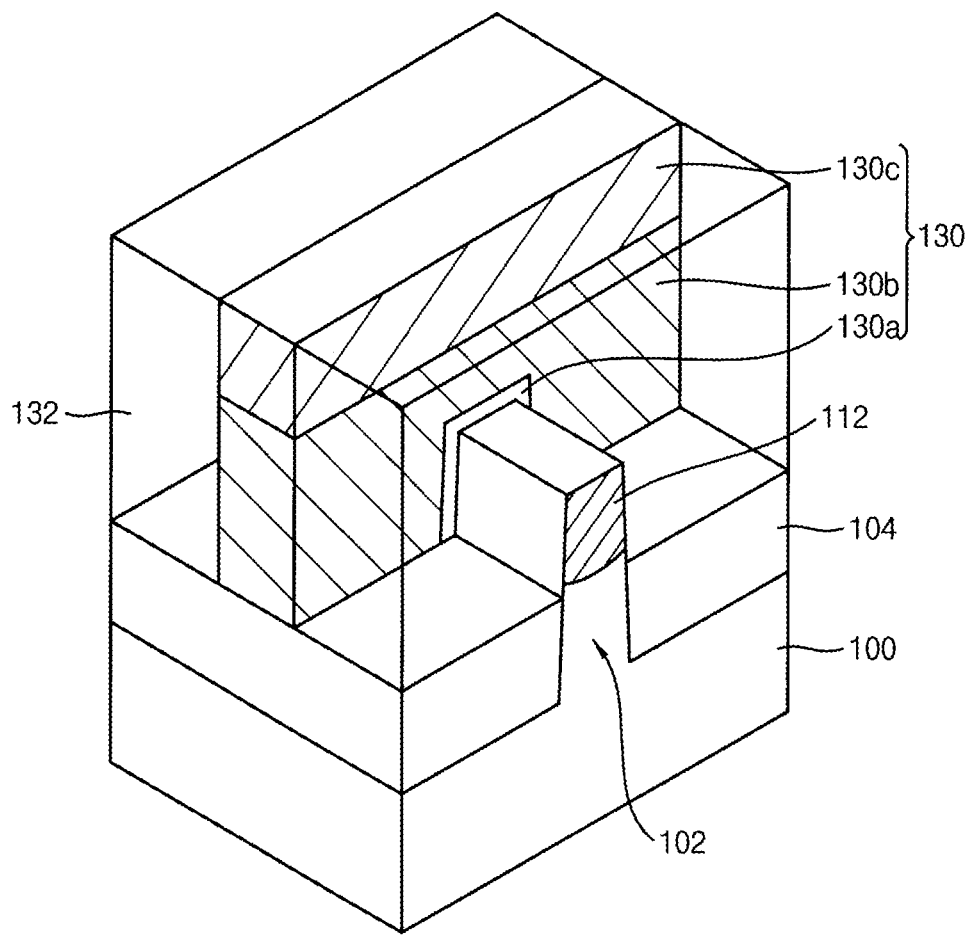
Figure 12B:
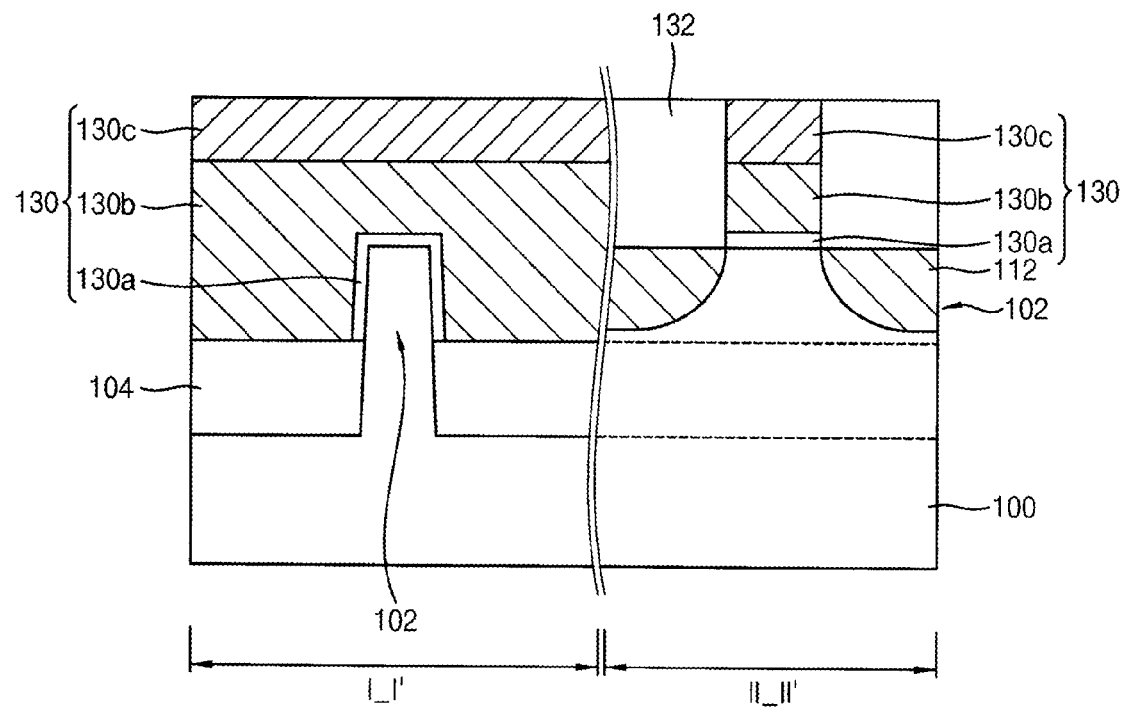

Referring to FIGS. 12A and 12B, a first insulating interlayer 132 may be formed on the substrate 100 to sufficiently cover the dummy gate structure 130, and may be planarized until a top surface of the dummy gate structure 130 may be exposed. In example embodiments, the planarization process may be performed by a chemical mechanical polishing (CMP) process and/or an etch back process.

Figure 13A:
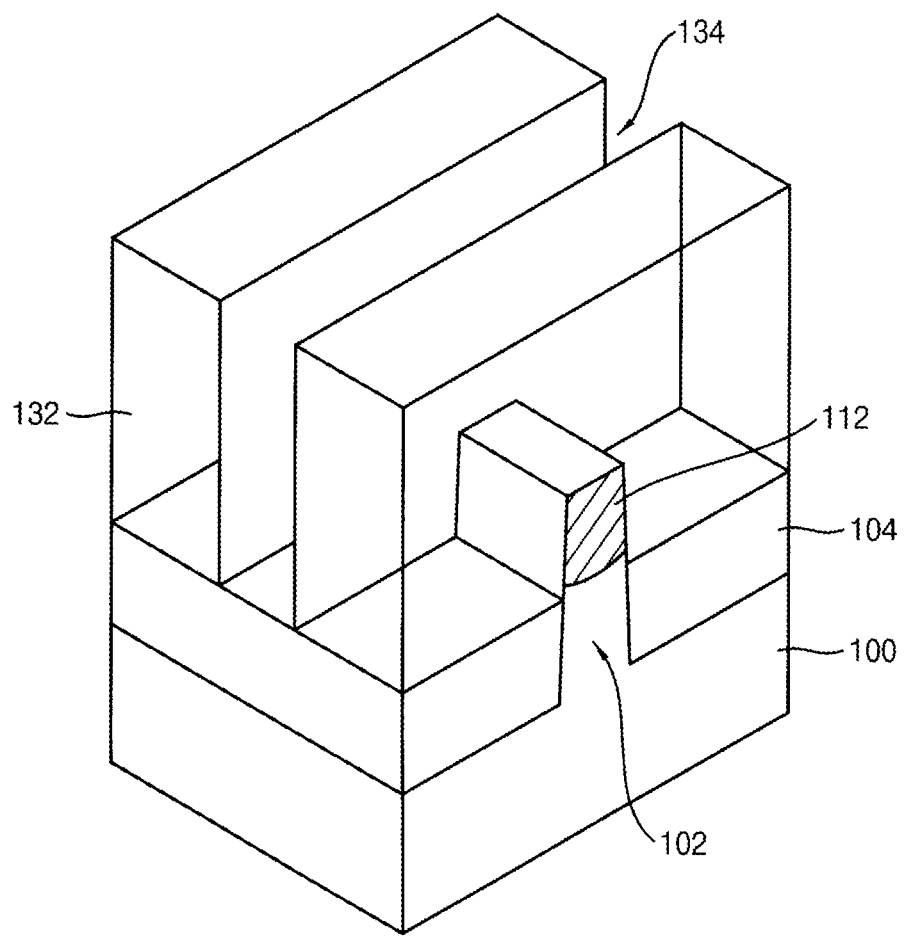
Figure 13B:
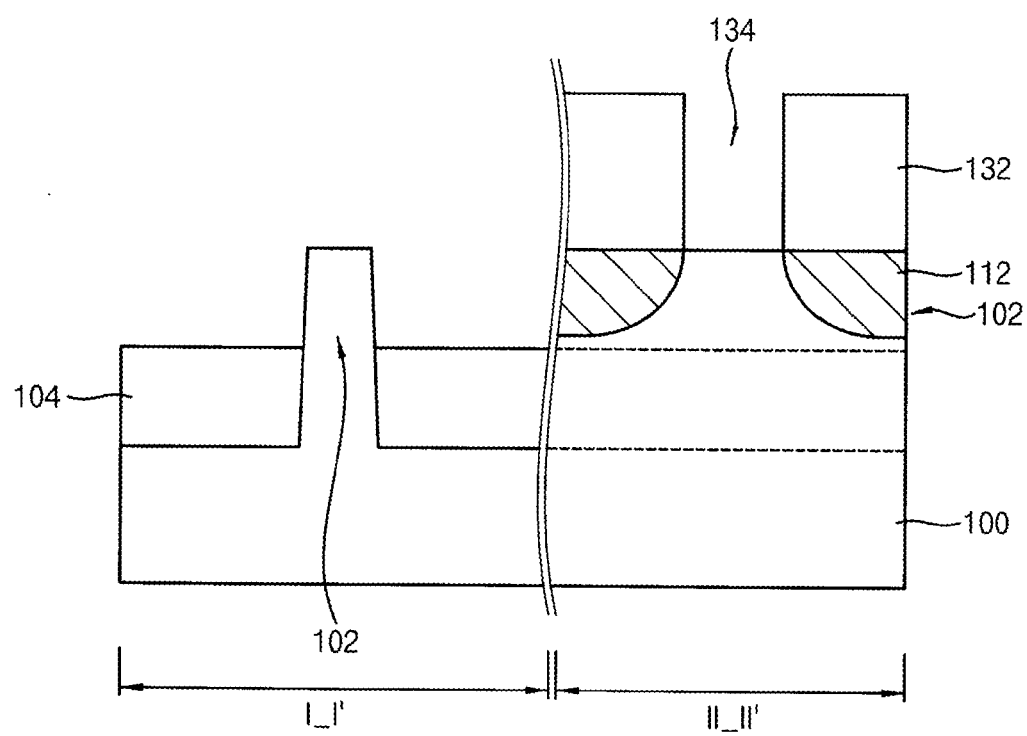

Referring to FIGS. 13A and 13B, the dummy gate structure 130 may be removed to form an opening 134 exposing a portion of the active fin 102. The portion of the active fin 102 exposed by the opening 134 may serve as a channel region of a transistor.

Figure 14A:
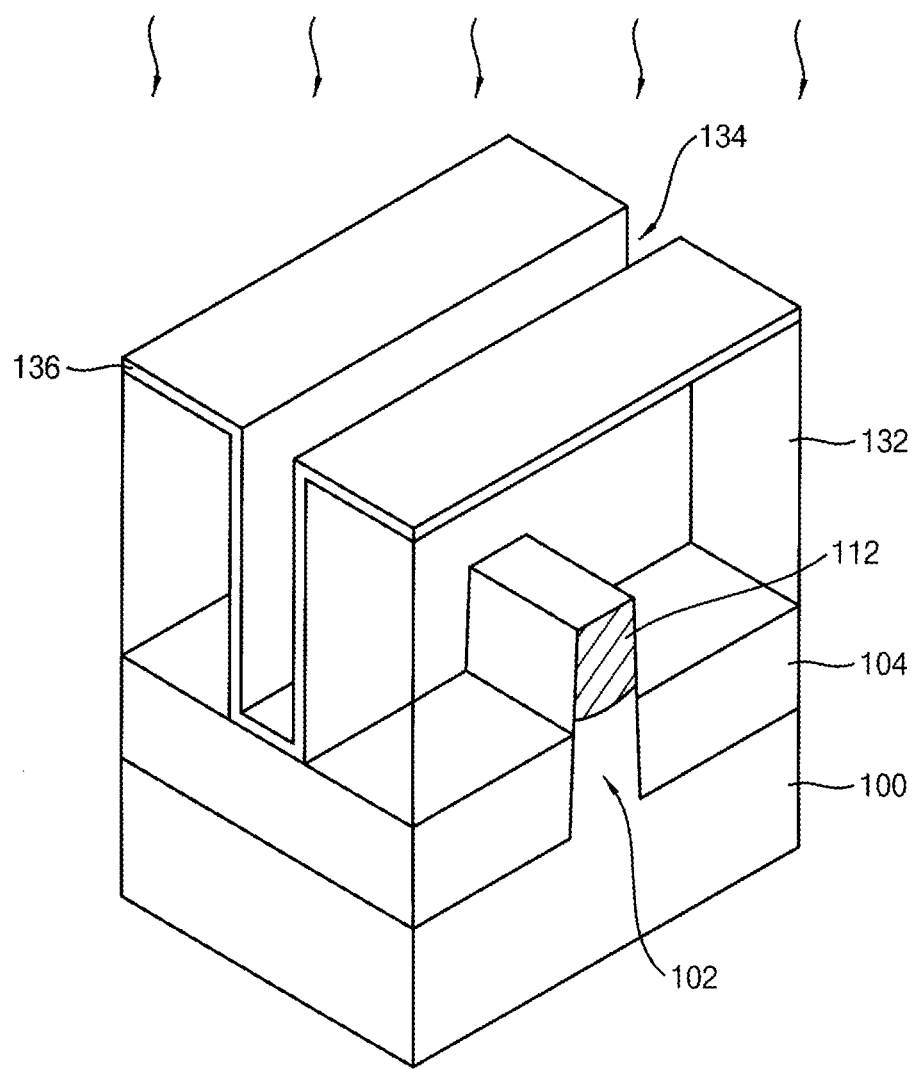
Figure 14B:
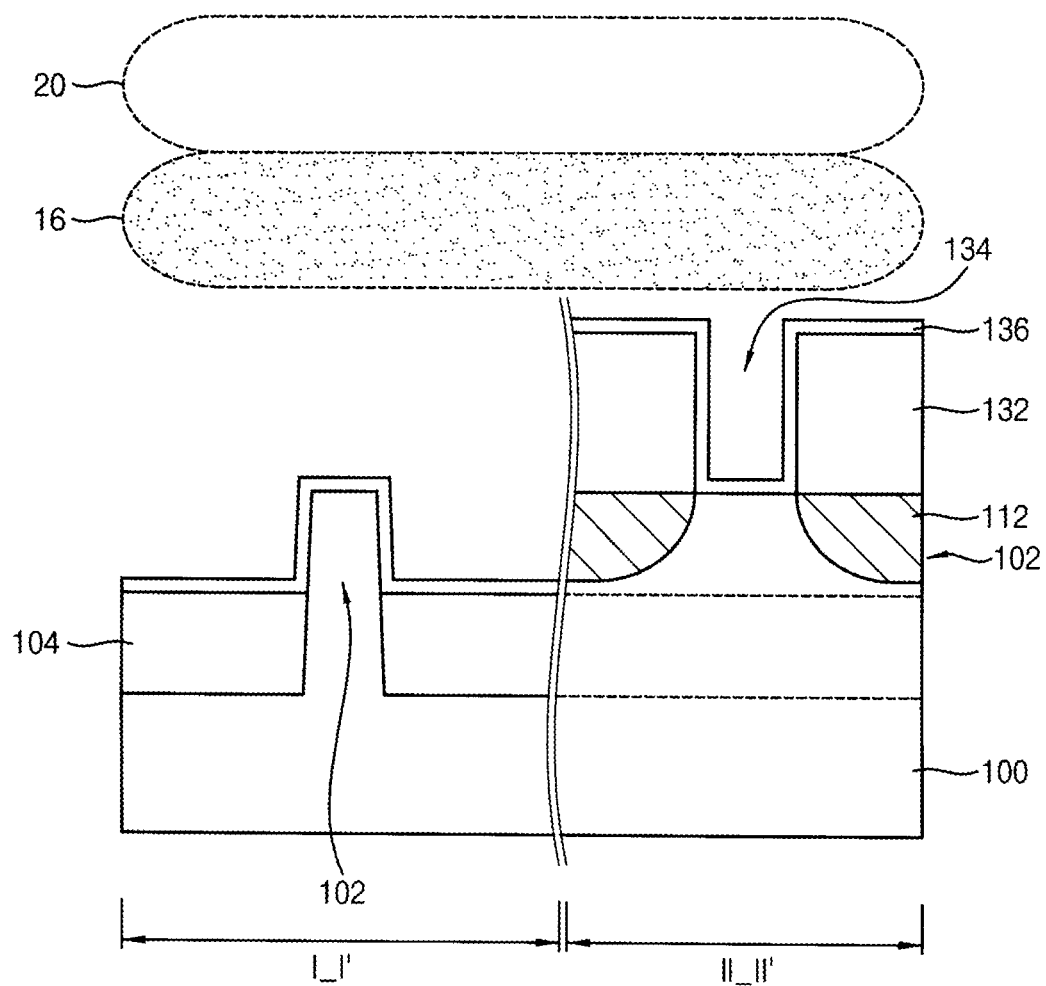

Referring to FIGS. 14A and 14B, a preliminary gate insulation layer may be formed on the exposed portion of the active fin 102, a sidewall of the opening 134 and the first insulating interlayer 132. In example embodiments, the preliminary gate insulation layer may be formed to include a metal oxide layer having a high dielectric constant. Alternatively, the preliminary gate insulation layer may be formed to include a silicon oxide layer and a metal oxide layer sequentially stacked.

Particularly, the silicon oxide layer may be formed on the portion of the active fin 102 exposed by the opening 134. The metal oxide layer may be conformally formed on the silicon oxide layer, the sidewall of the opening 134 and the first insulating interlayer 132. The metal oxide layer may be formed to include, e.g., hafnium oxide, tantalum oxide, and/or zirconium oxide, and may be formed by a CVD process or an ALD process.

As illustrated in FIG. 1, the preliminary gate insulation layer may include various defects therein. For example, the preliminary gate insulation layer may include undesired elements, e.g., carbon and/or fluorine, which may degrade electrical characteristics thereof. Also, the preliminary gate insulation layer may include trap sites of electrons or holes therein.

A hydrogen plasma treatment may be performed on the preliminary gate insulation layer so that a gate insulation layer 136 may be formed. The hydrogen plasma treatment may be substantially the same as or similar to that illustrated with reference to FIGS. 2 and 3 to form the hydrogen plasma region including the first plasma region 16 and the second plasma region 20.

Thus, the gate insulation layer 136 may have reduced defects and/or undesired elements, e.g., carbon or fluorine.

Figure 15A:
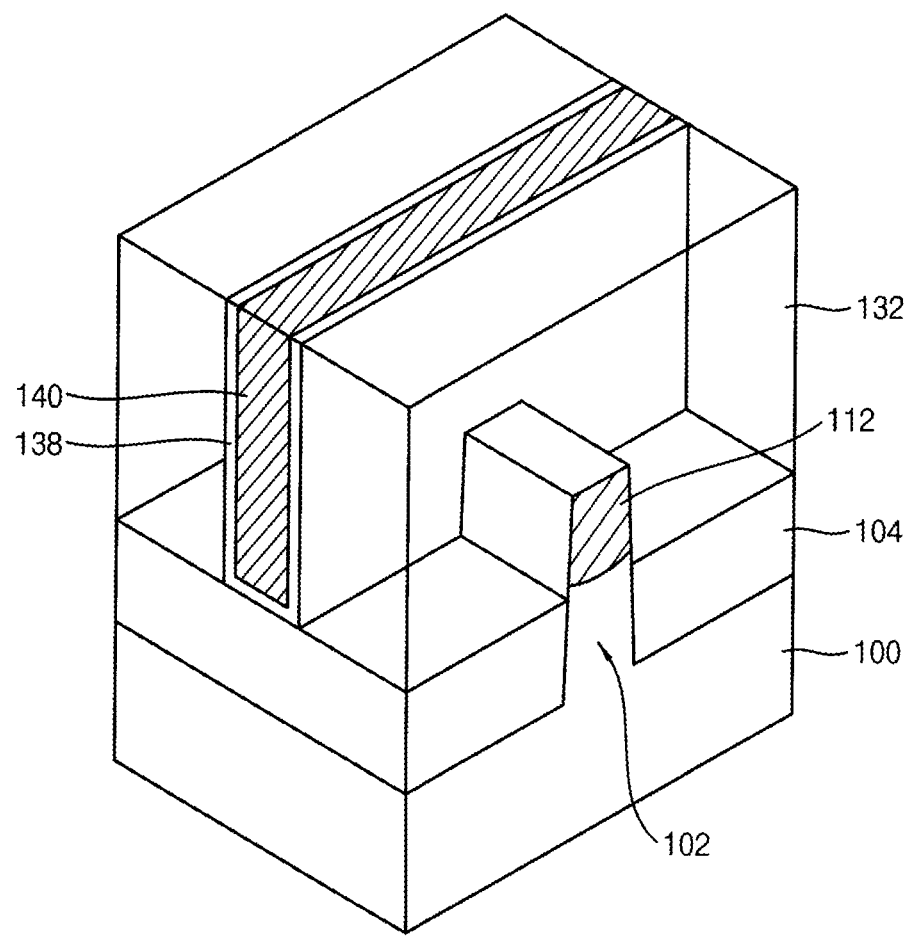
Figure 15B:
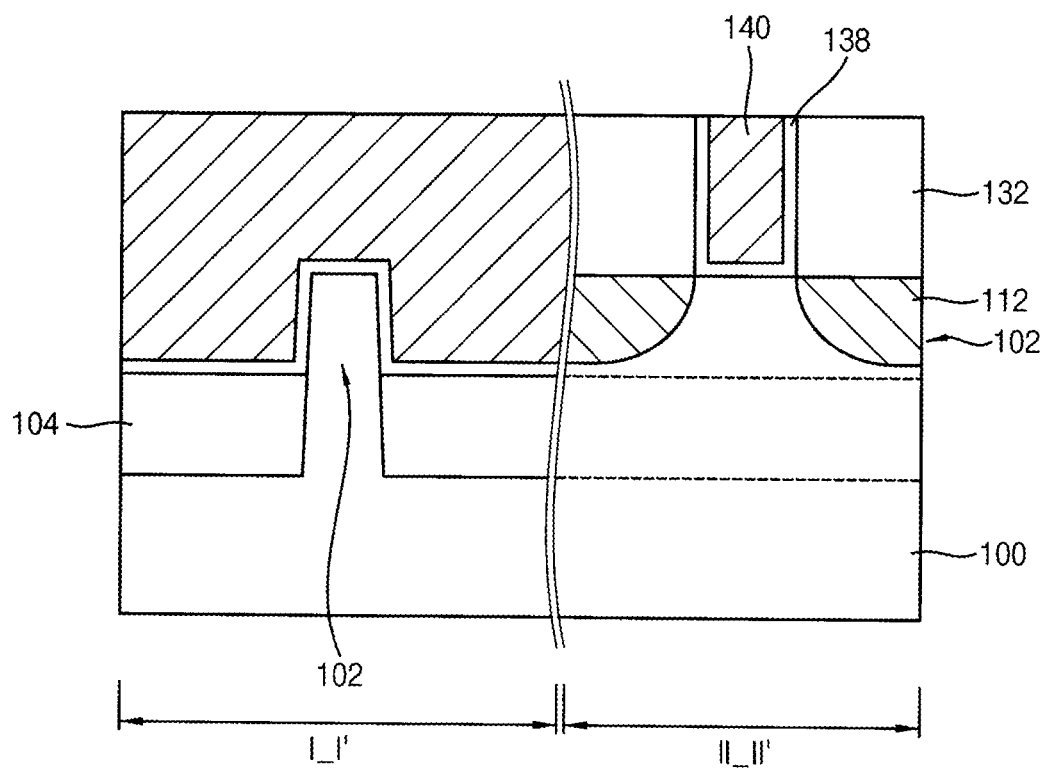

Referring to FIGS. 15A and 15B, a gate electrode layer may be formed on the gate insulation layer 136 to fill the opening 134.

In example embodiments, the gate insulation layer 136 may include a metal oxide layer, and the gate electrode layer may include a metal and/or a metal nitride. The gate electrode layer may be formed to include, e.g., aluminum (Al), copper (Cu) and/or tantalum (Ta). The gate electrode layer may be formed by a CVD process, an ALD process, and/or a PVD process.

The gate electrode layer and the gate insulation layer 136 may be planarized until a top surface of first insulating interlayer 132 may be exposed to form a gate electrode 140 and a gate insulation pattern 138, respectively. In example embodiments, the planarization process may be performed by a CMP process and/or an etch back process.

As illustrated above, the gate insulation pattern 138 having the high dielectric constant may be formed. Also, the gate insulation pattern 138 may be performed by the hydrogen plasma treatment, so that the gate insulation pattern 138 may have reduced defects and/or undesired elements, e.g., carbon and/or fluorine. Thus, semiconductor device including the transistor may have improved electrical characteristics and higher reliability.

FIGS. 16 to 23 are cross-sectional views illustrating stages of a method of manufacturing a semiconductor device in accordance with example embodiments.

Figure 16:
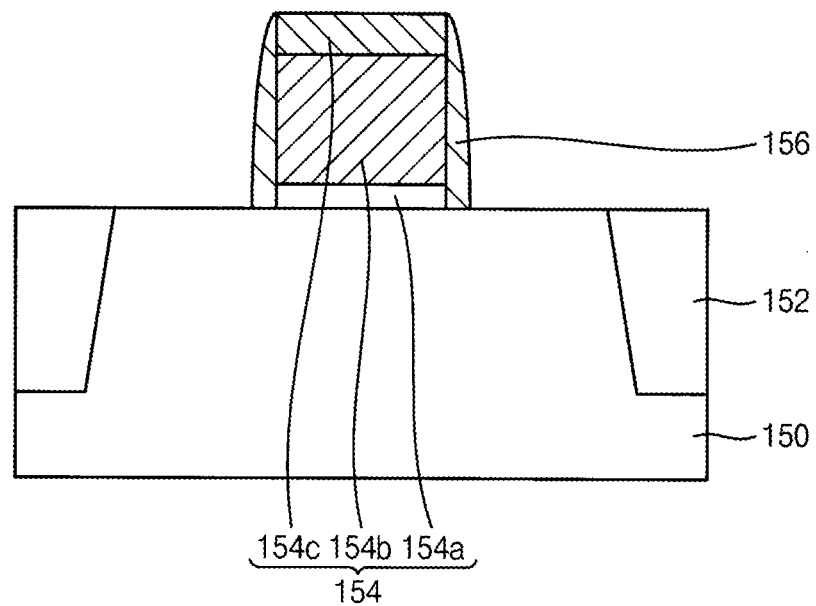

Referring to FIG. 16, a dummy gate structure 154 may be formed on a substrate 150 on which an isolation layer 152 may be formed.

The substrate 150 may be a silicon substrate, a germanium substrate, a silicon-germanium substrate, or a Group III-V compound semiconductor substrate including GaP, GaAs, or GaSb. In example embodiments, the substrate 150 may include a silicon-on-insulator (SOI) substrate and/or a germanium-on-insulator (GOI) substrate. At least a portion of an upper surface of the substrate 150 may serve as a channel region of a MOS transistor. In example embodiments, the substrate 150 may be a silicon-germanium substrate.

The isolation layer 152 may be formed by performing an STI process. The isolation layer 152 may define a field region and an active region in the substrate 150.

The dummy gate structure 154 may be formed to include a dummy gate insulation pattern 154a, a dummy gate electrode 154b and a hard mask 154c. Spacers 156 may be formed on sidewalls of the dummy gate structure 154.

The dummy gate insulation pattern 154a may be formed to include an oxide, e.g., silicon oxide, and the dummy gate electrode 154b may be formed to include, e.g., polysilicon. The first mask 154c may be formed to include a nitride, e.g., silicon nitride.

Figure 17:
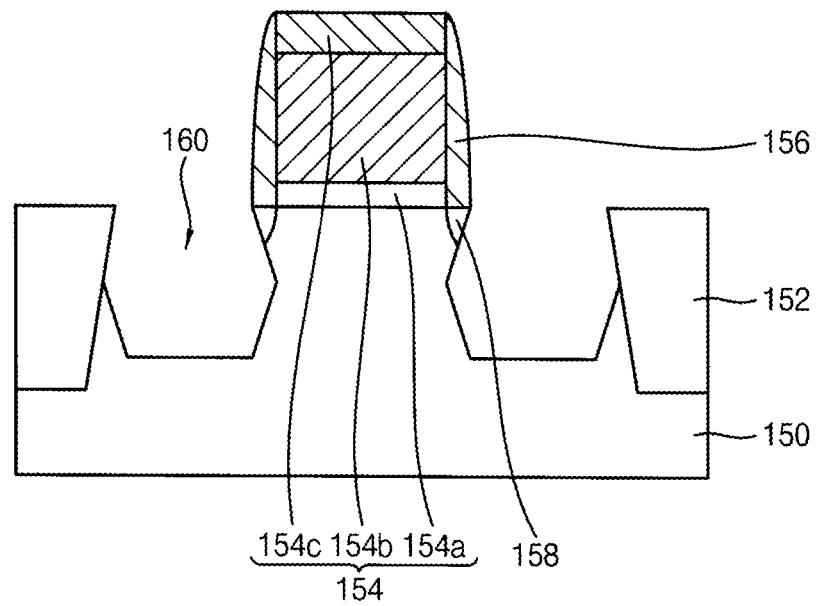

Referring to FIG. 17, impurities may be doped into the substrate 150 adjacent to the dummy gate structure 154 to form preliminary impurity regions 158. The preliminary impurity regions 158 may serve as lightly doped source/drain regions.

An upper portion of the active region of the substrate 150 adjacent to the dummy gate structure 154 may be etched to form a trench 160. In example embodiments, the trench 160 may be formed to have a sigma shape. Alternatively, the trench 160 may be formed to have a "U" shape, a ball shape, or a vertical sidewall. As the trench 160 has the sigma shape, a stress may be applied to a channel region of the substrate 100, and a charge mobility of a MOS transistor substantially formed may increase.

Figure 18:
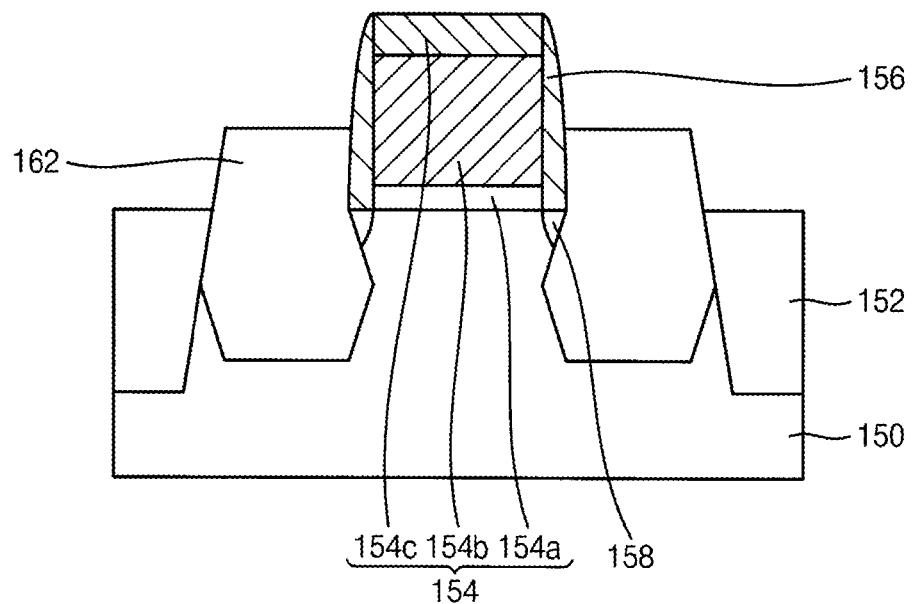

Referring to FIG. 18, an epitaxial layer 162 may be formed to fill the trench 160.

Particularly, the epitaxial layer 162 may be formed by a selective epitaxial growth (SEG) process using an upper surface of the substrate 100 exposed by the trench 160 as a seed. The SEG process may be performed using a silicon source gas, e.g., dichlorosilane ($SiH_2Cl_2$) gas, a germanium source gas, e.g., germane ($GeH_4$) gas to form a single crystalline silicon-germanium layer. In example embodiments, the epitaxial layer 162 may fill the trench 160, and further grow so that a top surface of the epitaxial layer 162 may be higher than that of the substrate 150.

In example embodiments, when the epitaxial layer 180 is formed, impurities may be doped so that impurity regions (not shown) may be formed in the epitaxial layer 180.

Figure 19:
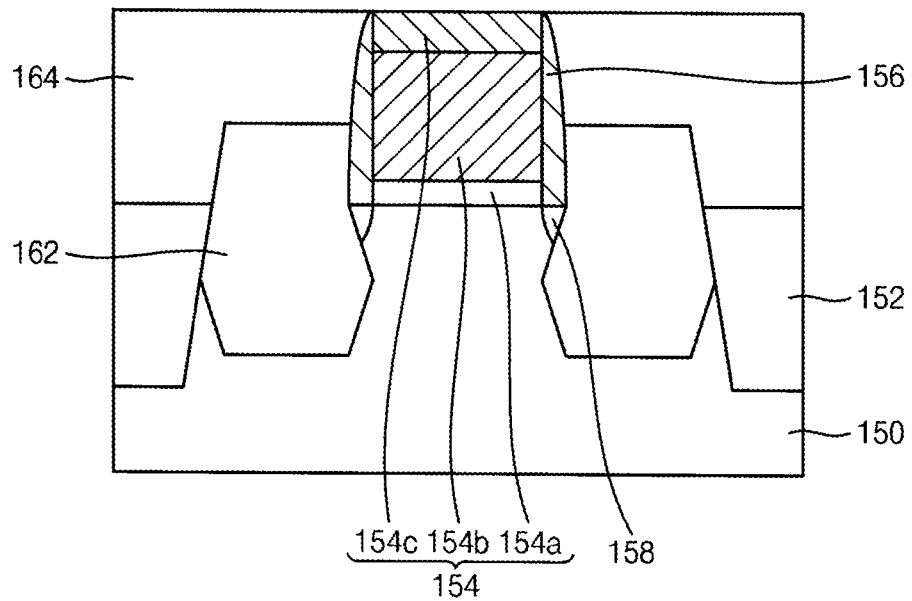

Referring to FIG. 19, a first insulating interlayer 164 may be formed to cover the dummy gate structure 154, the epitaxial layer 162 and the spacers 156, and may be planarized until a top surface of the dummy gate structure 154 may be exposed. The planarization process may be performed by a CMP process and/or an etch back process.

Figure 20:
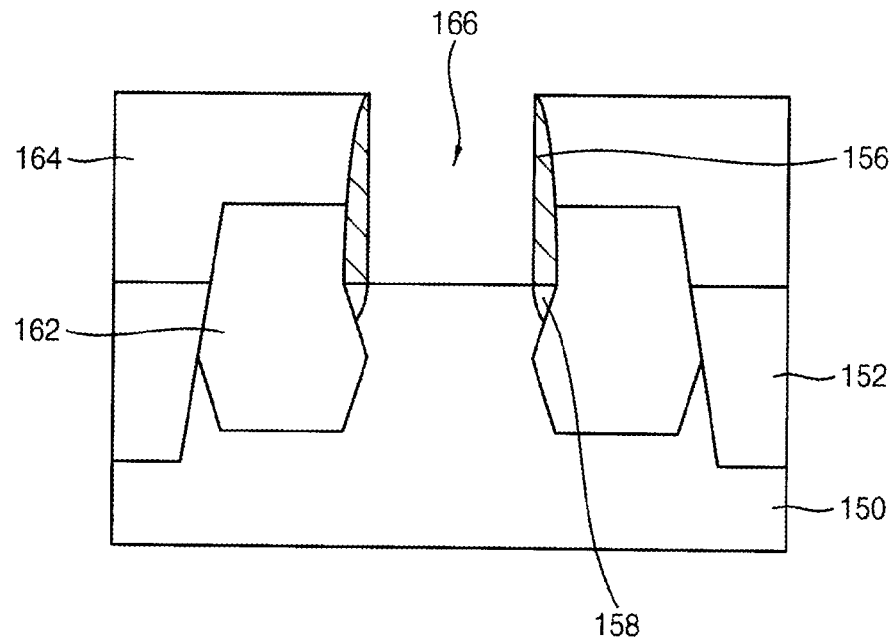

Referring to FIG. 20, the dummy gate structure 154a may be removed to form an opening 166 exposing a top surface of the substrate 150.

Figure 21:
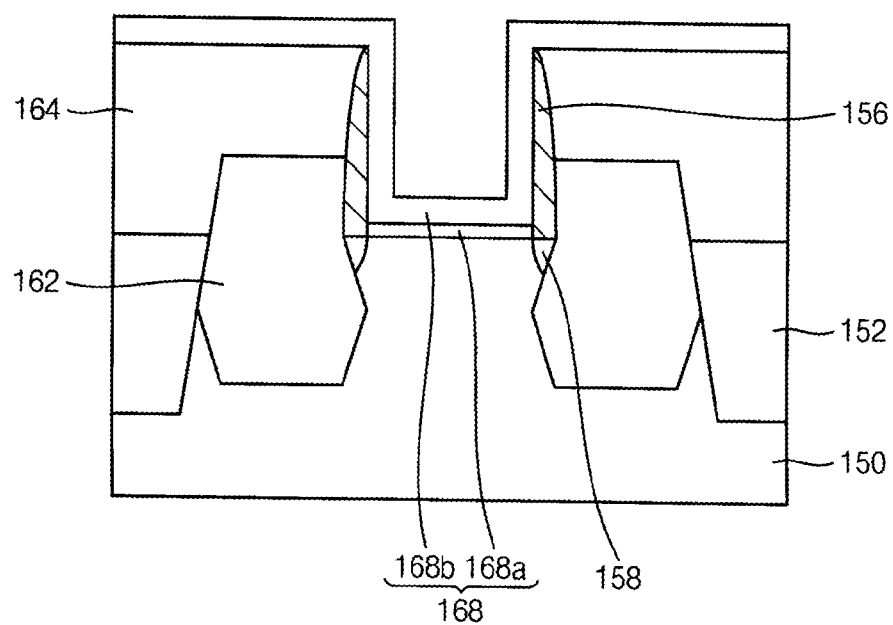

Referring to FIG. 21, a preliminary gate insulation layer 168 including a preliminary silicon oxide layer 168a and a preliminary high-k dielectric layer 168b may be formed on the exposed top surface of the substrate 150, a sidewall of the opening 166 and the first insulating interlayer 164. The preliminary gate insulation layer 168 may be formed to include a metal oxide having a high dielectric constant.

Particularly, after performing a thermal oxidation process on the top surface of the substrate 150 exposed by the opening 166 to form the preliminary silicon oxide layer 168a, the preliminary high-k dielectric layer 168b may be conformally formed on the silicon oxide layer 168a, the sidewall of the opening 166, and the first insulating interlayer 164. The preliminary high-k dielectric layer 168b may be formed to include a metal oxide having a high dielectric constant, e.g., hafnium oxide, tantalum oxide, or zirconium oxide, by a CVD process or an ALD process.

As illustrated in FIG. 1, the preliminary gate insulation layer 168 may include various defects. Particularly, the preliminary gate insulation layer 168 may include undesired elements, e.g., carbon or fluorine, which may degrade electrical characteristics thereof. Also, the preliminary gate insulation layer 168 may include trap sites of electrons or holes.

Figure 22:
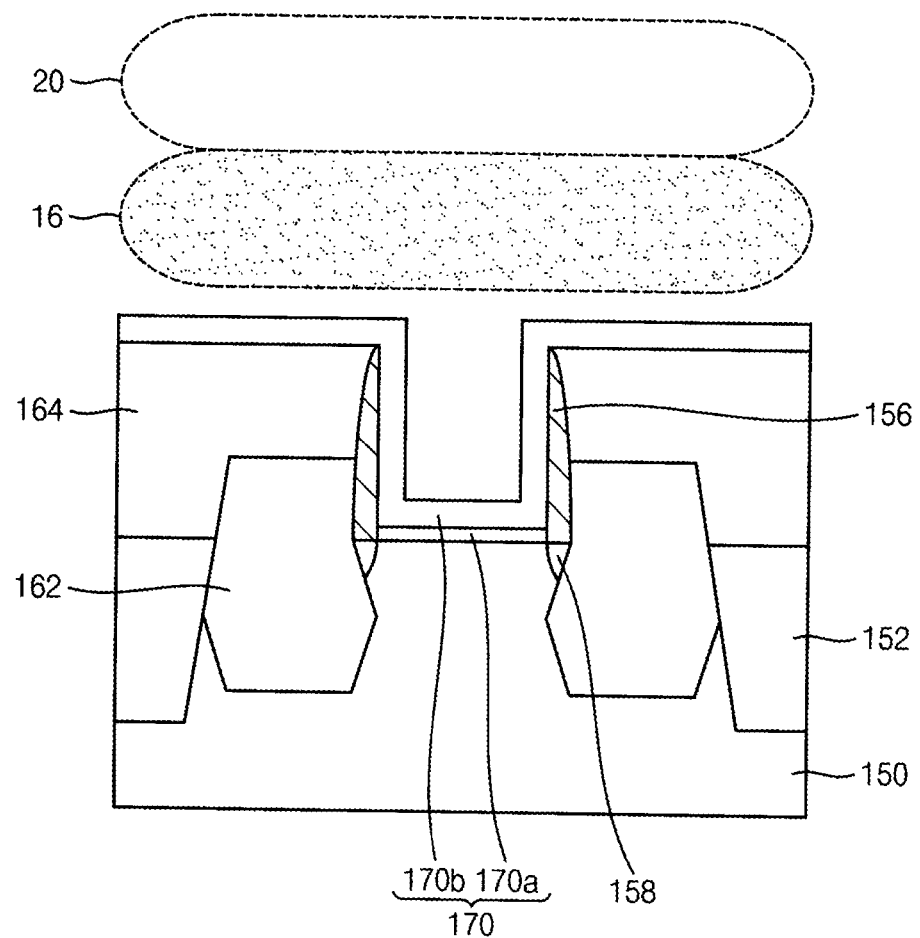

Referring to FIG. 22, a hydrogen plasma treatment may be performed on the preliminary gate insulation layer 168 to form a gate insulation layer 170 including a silicon oxide layer 170a and a high-k dielectric layer 170b. The hydrogen plasma treatment may be substantially the same as or similar to that illustrated with reference to FIGS. 2 and 3 to form the hydrogen plasma region including the first plasma region 16 and the second plasma region 20. The gate insulation layer 170 may have reduced defects and undesired elements, e.g., carbon or fluorine.

Figure 23:
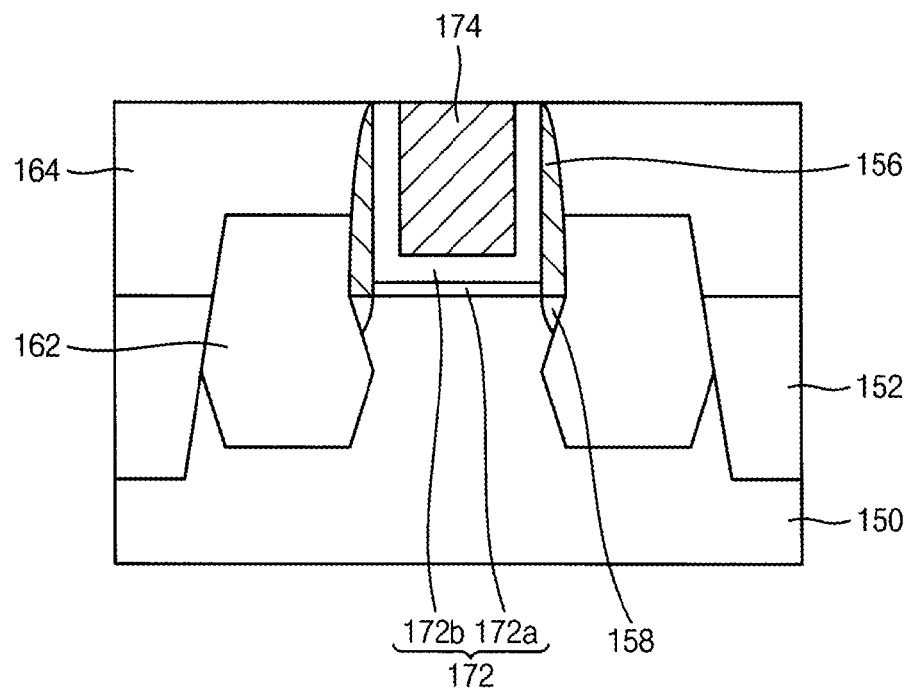

Referring to FIG. 23, a gate electrode layer may be formed on the gate insulation layer 170 to fill the opening 166 (see FIG. 20).

The gate electrode layer may be formed to include, e.g., aluminum (Al), copper (Cu) and/or tantalum (Ta), by a CVD process, an ALD process, and/or a PVD process.

The gate electrode layer and the gate insulation layer 170 may be planarized until a top surface of first insulating interlayer 164 may be exposed to form a gate electrode 174 and a gate insulation pattern 172 including a silicon oxide layer pattern 172a and a high-k dielectric layer pattern 172b, respectively. In example embodiments, the planarization process may be performed by a CMP process and/or an etch back process.

As illustrated above, the gate insulation pattern 172 having the high dielectric constant may be formed. Also, the gate insulation pattern 172 that may be formed by the hydrogen plasma treatment may have reduced defects and/or undesired elements, e.g., carbon and/or fluorine. Thus, semiconductor device including the transistor may have improved electrical characteristics and higher reliability.

Figure 24:
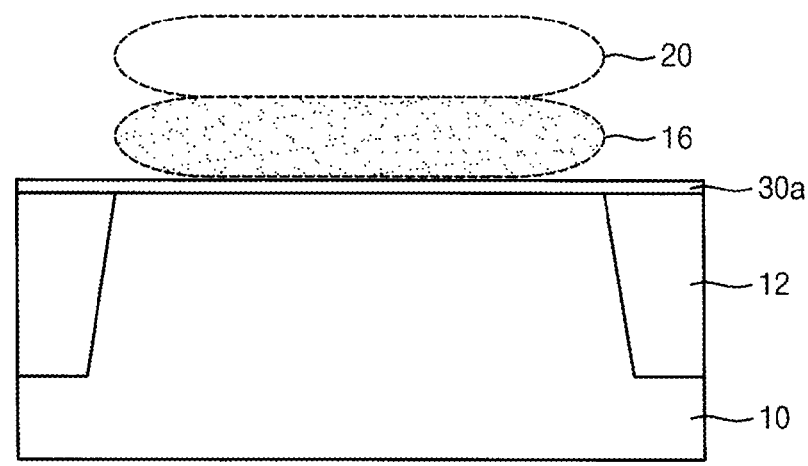
Figure 25:
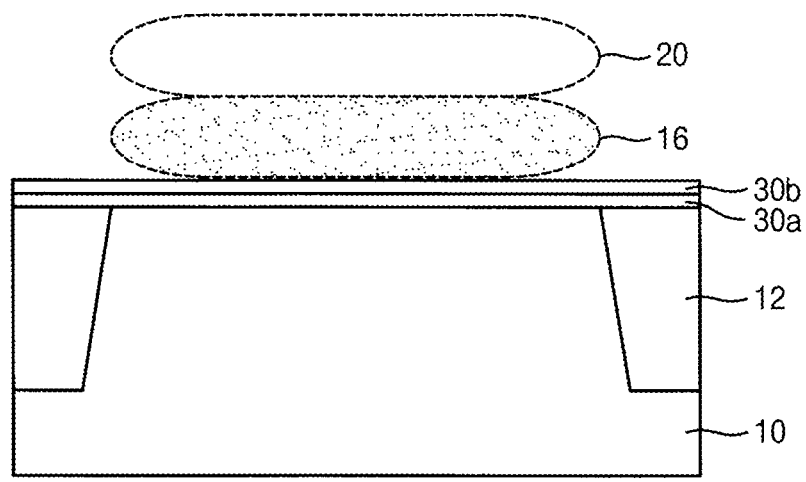
Figure 26:
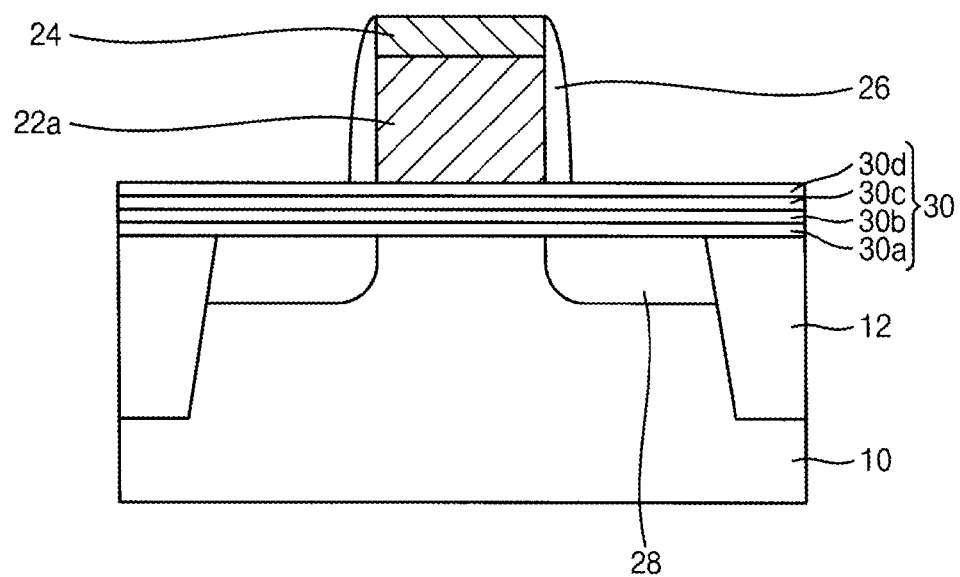

FIGS. 24 to 26 are cross-sectional views illustrating stages of a method of manufacturing a semiconductor device in accordance with example embodiments.

Referring to FIG. 24, a first preliminary gate insulation layer may be formed on a substrate 10 on which an isolation layer 12 may be formed. The first preliminary gate insulation layer may be formed to include, e.g., silicon oxide, silicon oxynitride, a metal and/or metal oxide.

A hydrogen plasma treatment may be performed on the first preliminary gate insulation layer so that a first gate insulation layer 30a may be formed. The hydrogen plasma treatment may be substantially the same as or similar to that illustrated with reference to FIGS. 2 and 3 to form the hydrogen plasma region including the first plasma region 16 and the second plasma region 20.

Referring to FIG. 25, a second preliminary gate insulation layer may be formed on the first gate insulation layer 30a. In example embodiments, the second preliminary gate insulation layer may include a material substantially the same as or different from that of the first gate insulation layer 30a. The second preliminary gate insulation layer may be formed to include, e.g., silicon oxide, silicon oxynitride, a metal, and/or metal oxide.

A hydrogen plasma treatment may be performed on the second preliminary gate insulation layer so that a second gate insulation layer 30b may be formed. The hydrogen plasma treatment may be substantially the same as or similar to that illustrated with reference to FIGS. 2 and 3 to form the hydrogen plasma region including the first plasma region 16 and the second plasma region 20.

Referring to FIG. 26, the process for forming the preliminary gate insulation layer and the hydrogen plasma treatment may be alternately and repeatedly performed on the second gate insulation layer 30b so that a gate insulation structure 30 including the first gate insulation layer 30a, the second gate insulation layer 30b, a third gate insulation layer 30c, and a fourth gate insulation layer 30d sequentially stacked may be formed. However, the present inventive concepts may not be limited thereto, and more than four gate insulation layers may be formed as the gate insulation structure 30.

Then, processes substantially the same as or similar to those illustrated with reference to FIGS. 4 to 6 may be performed. Thus, a MOS transistor including a gate electrode 22a and impurity regions 28 may be formed. A hard mask 24 may be formed on a top surface of the gate electrode 22a and spacers 26 may be formed on sidewalls of the gate electrode 22a.

The process for forming the gate insulation structure 30 may be performed regardless of the structure of the MOS transistor. In some example embodiments, the gate insulation layer of each of the transistors illustrated with reference to FIGS. 10A, 15A and 23 may be formed by performing the process for forming the gate insulation structure 30 as illustrated with reference to FIGS. 24 to 26.

Figure 27:
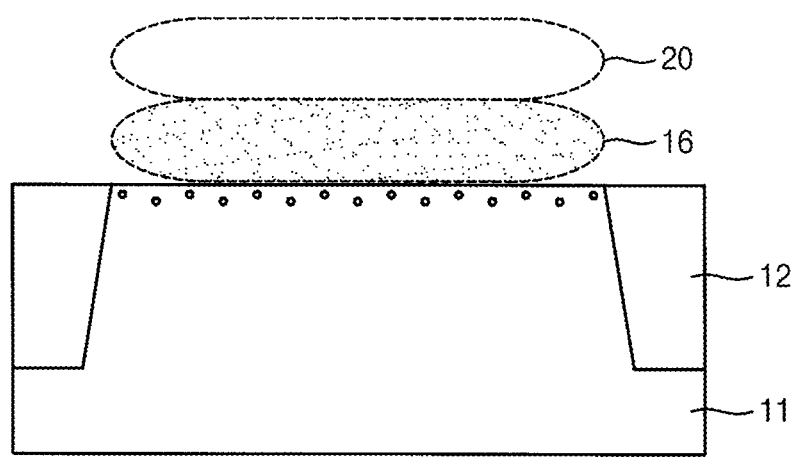
Figure 28:
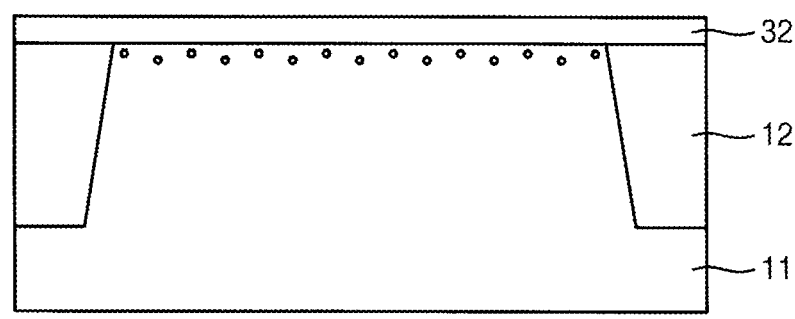
Figure 29:
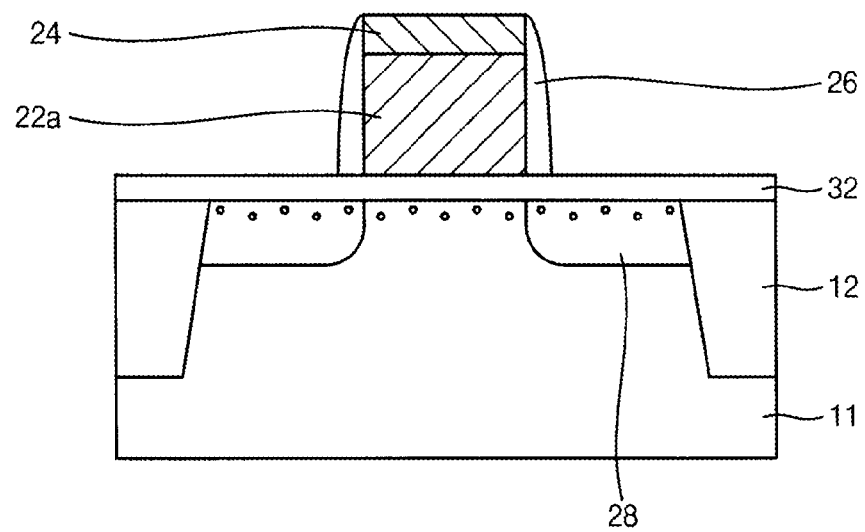

FIGS. 27 to 29 are cross-sectional views illustrating stages of a method of manufacturing a semiconductor device in accordance with example embodiments.

Referring to FIG. 27, an STI process may be performed to form an isolation pattern 12 on a preliminary substrate (not shown).

The preliminary substrate may be a silicon substrate, a germanium substrate, a silicon-germanium substrate, or a Group III-V compound semiconductor substrate including GaP, GaAs, or GaSb. The preliminary substrate may have a crystalline semiconductor, for example, a single crystalline semiconductor.

A hydrogen plasma treatment may be performed on the preliminary substrate so that a substrate 11 having a cured surface may be formed. The hydrogen plasma treatment may be substantially the same as or similar to that illustrated with reference to FIGS. 2 and 3 to form the hydrogen plasma region including the first plasma region 16 and the second plasma region 20.

Alternatively, after performing the hydrogen plasma treatment on the preliminary substrate to form the substrate 11, and the isolation pattern 12 may be formed by the STI process.

Referring to FIG. 28, a gate insulation layer 32 may be formed on the substrate 11. The gate insulation layer 32 may be formed to include an oxide, e.g., silicon oxide, silicon oxynitride, and/or a metal oxide. The gate insulation layer 32 may be formed by a thermal oxidation process, a CVD process and/or an ALD process.

A hydrogen plasma treatment may be performed on the gate insulation layer 32. Alternatively, the hydrogen plasma treatment on the gate insulation layer 32 may be skipped.

Referring to FIG. 29, processes substantially the same as or similar to those illustrated with reference to FIGS. 4 to 6 may be performed. Thus, a MOS transistor including a gate electrode 22a and impurity regions 28 may be formed. A hard mask 24 may be formed on a top surface of the gate electrode 22a and spacers 26 may be formed on sidewalls of the gate electrode 22a.

As illustrated above, the hydrogen plasma treatment may be performed on the substrate 11 before forming the gate insulation layer 32. In example embodiments, the hydrogen plasma treatment on the gate insulation layer 32 may be selectively performed.

The hydrogen plasma treatment may be performed on the substrate 11 before forming a gate insulation layer or a preliminary gate insulation layer, regardless of a structure of a MOS transistor.

Thus, when each of the transistors illustrated with reference to FIGS. 10A, 15A, 23 and 26 may be formed, the hydrogen plasma treatment may be further performed on the substrate before forming the preliminary gate insulation layer.

EXPERIMENT

Example 1

Example 1 was a MOS transistor formed by processes substantially the same as those illustrated with reference to FIGS. 1 to 6. When the MOS transistor of Example 1 was manufactured, n-type impurities were doped into a substrate so that an NMOS transistor was manufactured.

Particularly, a single crystalline silicon substrate was used. In a hydrogen plasma treatment, hydrogen gas and argon gas were used. A hydrogen plasma treatment was performed at a temperature of about 500° C. for about 1 minute under a pressure of about 10 Torr.

Comparative Example 1

Comparative Example 1 was an NMOS transistor formed by processes substantially the same as those for forming the MOS transistor of Example 1, except that the hydrogen plasma treatment on the gate insulation layer was not performed.

Figure 30:
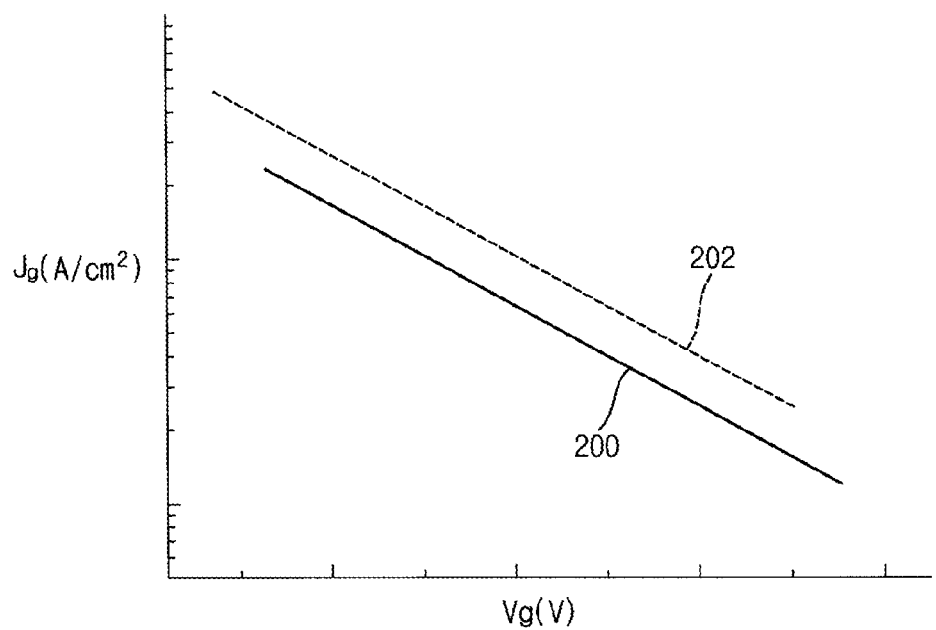

FIG. 30 is a graph illustrating a gate current density "Jg" versus an equivalent oxide thickness (EOT) of the transistors of Example 1 and Comparative Example 1.

In FIG. 30, a reference numeral "200" represents a graph for Example 1, and a reference numeral "202" represents a graph for Comparative Example 1.

Referring to FIG. 30, a Jg of Example 1 is lower than that of Comparative Example 1 under the same EOT. Thus, a leakage current of Example 1 is less than that of Comparative Example 1.

Figure 31:
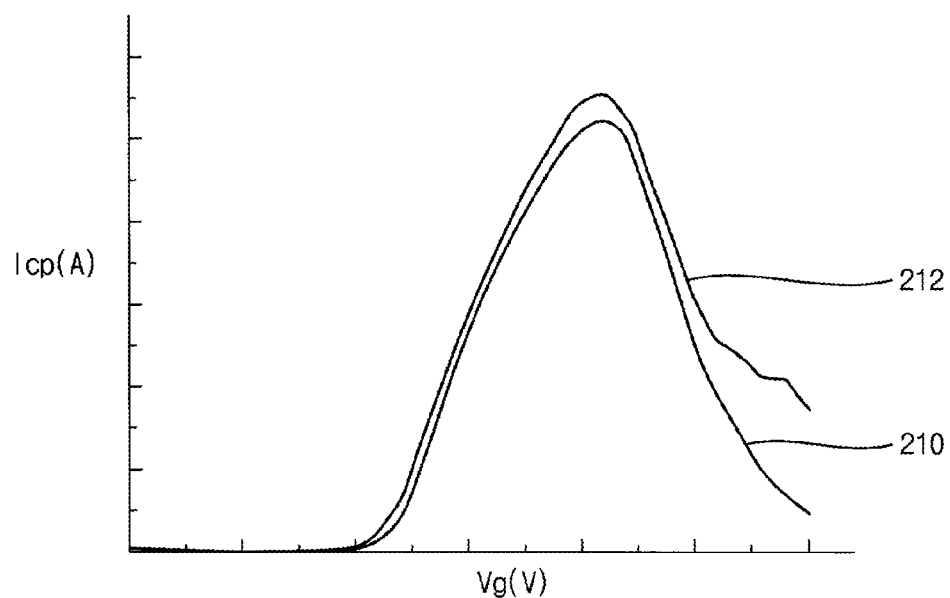

FIG. 31 is a graph illustrating charge pumping current "Icp" versus a gate voltage of each of Example 1 and Comparative Example 1.

In FIG. 31, a reference numeral "210" represents results of Example 1, and a reference numeral "212" represents results of Comparative Example.

Referring to FIG. 31, an Icp of Example 1 is lower than that of Comparative Example 1 under the same gate voltage. Thus, trapped charges of Example 1 at an interface between a substrate and a gate insulation pattern are smaller than those of Comparative Example. Example 1 has a higher reliability.

Example 2

Example 2 was a structure including a gate insulation layer on a substrate. Particularly, the gate insulation layer was formed on the substrate by the processes substantially the same as those illustrated with reference to FIGS. 1 to 3. That is, after performing a thermal oxidation process on an upper portion of a single crystal substrate to form a silicon oxide layer, and a hydrogen plasma treatment on the silicon oxide layer was performed to form the gate insulation layer. In the hydrogen plasma treatment, hydrogen gas and argon gas were used. A hydrogen plasma treatment was performed at a temperature of about 500° C. for about 1 minute under a pressure of about 10 Torr.

Comparative Example 2

Comparative Example 2 a structure including a silicon oxide layer on a substrate. The silicon oxide layer was formed by performing a thermal oxidation process on an upper portion of a single crystal substrate. However, after performing the thermal oxidation process, a hydrogen plasma treatment on the silicon oxide layer was not performed. That is, comparative Example 2 was formed by processes substantially the same as those for forming Example 2, except that the hydrogen plasma treatment of the silicon oxide layer was not performed.

Figure 32:
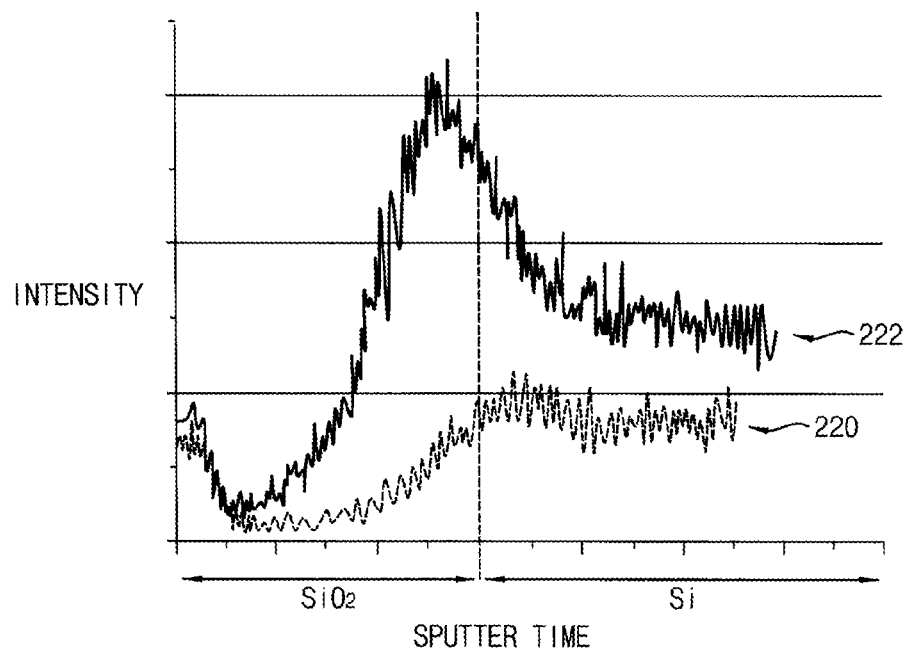
Figure 33:
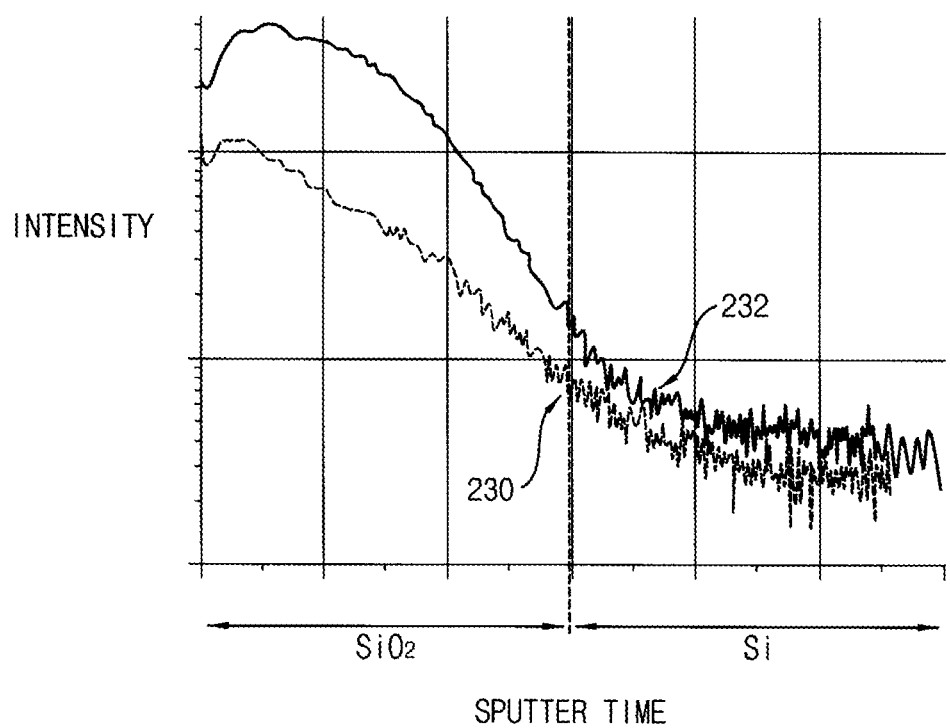

FIG. 32 shows intensities of carbon measured by time-of-flight secondary ion mass spectrometry (TOF-SIMS) in a silicon oxide layer and a substrate of Example 2 and in those of Comparative Example 2, respectively. FIG. 33 shows intensities of fluorine measured by TOF-SIMS in a silicon oxide layer and a substrate of Example 2 and in those of Comparative Example 2, respectively.

In FIG. 32, a reference numeral "220" represents results of Example 2, and a reference numeral "222" represents results of Comparative Example 2. In FIG. 33, a reference numeral "220" represents results of Example 2, and a reference numeral "222" represents results of Comparative Example 2.

Referring to FIG. 32, intensities of carbon in silicon oxide and a substrate of Example 2 is lower than those of Comparative Example 2. Particularly, intensities of carbon of interface between the silicon oxide and the substrate of Example 2 are relatively low.

Referring to FIG. 33, intensities of fluorine in silicon oxide and a substrate of Example 2 is lower than those of Comparative Example 2. Particularly, intensities of fluorine of interface between the silicon oxide and the substrate of Example 2 are relatively low.

Thus, undesired elements, e.g., carbon and/or fluorine, in the silicon oxide and the substrate may be reduced by performing the hydrogen plasma treatment so that the MOS transistor may have improved electrical characteristics.

The above semiconductor device may be applied to various types of memory devices and/or systems including MOS transistors. For example, the semiconductor device and methods of forming the same may be applied to logic devices, e.g., central processing units (CPUs), main processing units (MPUs), or application processors (APs), and methods of forming the same. Additionally, the semiconductor device and methods of forming the same may be applied to volatile memory devices, e.g., DRAM devices or SRAM devices, or non-volatile memory devices, e.g., flash memory devices, PRAM devices, MRAM devices or RRAM devices, and methods of forming the same.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming a preliminary gate insulation layer on a substrate, at least a portion of the substrate serving as a channel region;
    performing a hydrogen plasma treatment on the preliminary gate insulation layer to form a gate insulation layer, the hydrogen plasma treatment including,
        supplying a hydrogen-containing gas and an inert gas in a chamber via different gas supply parts to form a hydrogen plasma region and an inert gas plasma region in the chamber, respectively;
    forming a gate electrode on the gate insulation layer; and
    forming impurity regions at upper portions of the substrate adjacent to the gate electrode.

2. The method of claim 1, wherein
    the performing uses a frequency power of about 2 GHz to about 3 GHz, and
    the supplying forms the hydrogen plasma region and the inert gas plasma region by a microwave method.

3. The method of claim 1, wherein
    the supplying supplies the hydrogen-containing gas via a first gas supply part and the inert gas via a second gas supply part, the first gas supply part being closer to the substrate than the second gas supply part, and
    the supplying forms the hydrogen plasma region closer to the substrate than the inert gas plasma region.

4. The method of claim 1, wherein the supplying forms the hydrogen plasma region to be at a lower level than the inert gas plasma region in the chamber.

5. The method of claim 1, prior to the forming a preliminary gate insulation layer, further comprising:
   etching the substrate to form a trench; and
   forming an isolation layer to fill a lower portion of the trench so that an active fin is defined.

6. The method of claim 1, prior to the forming a preliminary gate insulation layer, further comprising:
   performing a hydrogen plasma treatment on the substrate.

7. The method of claim 1, after the forming a gate electrode, further comprising:
   performing a hydrogen plasma treatment on the substrate including the gate electrode.

8. The method of claim 1, wherein
   the forming a preliminary gate insulation layer forms at least two layers including a first insulation layer and a second insulation layer, and
   the performing performs a first hydrogen plasma treatment after forming the first insulation layer and a second hydrogen plasma treatment after forming the second insulation layer.

9. A method of manufacturing a semiconductor device, the method comprising:
   forming impurity regions in portions of a substrate, the impurity regions serving as source and drain regions;
   forming an insulating interlayer on the substrate, the insulating interlayer including an opening exposing a top surface of the substrate between the impurity regions;
   forming a preliminary gate insulation layer on the exposed top surface of the substrate and a sidewall and a top surface of the insulating interlayer;
   performing a hydrogen plasma treatment on the preliminary gate insulation layer to form a gate insulation layer; and
   forming a gate electrode on the gate insulation layer, the gate electrode filling the opening.

10. The method of claim 9, wherein the performing a hydrogen plasma treatment comprises:
    loading the substrate including the preliminary gate insulation layer thereon into a chamber;
    supplying a hydrogen-containing gas and an inert gas into the chamber via different gas supply parts; and
    forming a hydrogen plasma region and an inert gas plasma region in the chamber.

11. The method of claim 10, wherein
    the supplying supplies the hydrogen-containing gas via a first gas supply part and the inert gas via a second gas supply part, the first gas supply part being closer to the substrate than the second gas supply part, and
    the hydrogen plasma region is formed closer to the substrate than the inert gas plasma region.

12. The method of claim 10, wherein
    the performing uses a frequency power of about 2 GHz to about 3 GHz, and
    the forming a hydrogen plasma region and an inert gas plasma region forms the hydrogen plasma region and the inert gas plasma region by a microwave method.

13. The method of claim 9, prior to the forming a preliminary gate insulation layer, further comprising:
    performing a hydrogen plasma treatment on the top surface of the substrate exposed by the opening.

14. The method of claim 9, wherein
    the forming a preliminary gate insulation layer forms at least two layers including a first insulation layer and a second insulation layer, and
    the performing performs a first hydrogen plasma treatment after forming the first insulation layer and a second hydrogen plasma treatment after forming the second insulation layer.

15. The method of claim 14, wherein the forming a preliminary gate insulation layer forms each of the first and second insulation layers including one or more of silicon oxide, silicon oxynitride, a metal, and metal oxide.

16. A method of performing a hydrogen plasma treatment, the method comprising:
    forming an oxide layer on a substrate;
    loading the substrate including the oxide layer in a chamber; and
    performing a hydrogen plasma treatment on the oxide layer including,
       forming a hydrogen plasma region over the oxide layer by supplying a hydrogen-containing gas to the chamber via a first gas supply port, and
       forming an inert gas plasma region over the hydrogen plasma region by supplying an inert gas to the chamber via a second gas supply port.

17. The method of claim 16, wherein the performing uses a frequency power of about 2 GHz to about 3 GHz to form the hydrogen plasma region and the inert gas plasma region by a microwave method.

18. The method of claim 16, wherein the loading loads the substrate onto a loading chuck at a lower portion of the chamber.

19. The method of claim 18, wherein
    the loading loads the substrate onto a loading chuck heated to a temperature of about 300° C. to about 500° C., and
    the performing performs the hydrogen plasma treatment at a pressure in a range of about 1 mTorr to about 100 Torr for about 0.5 minutes to about 10 minutes.

20. The method of claim 16, further comprising:
    forming a gate electrode on the plasma-treated oxide layer; and
    forming impurity regions at upper portions of the substrate adjacent to the gate electrode.

* * * * *